(12) United States Patent
Kobayashi et al.

(10) Patent No.: US 6,949,394 B2
(45) Date of Patent: Sep. 27, 2005

(54) OPTICAL SEMICONDUCTOR DEVICE AND METHOD OF FABRICATING THE SAME

(75) Inventors: Fumihiko Kobayashi, Kanagawa (JP); Take Miyazawa, Kanagawa (JP); Hidefumi Mori, Tokyo (JP); Jun-ichi Nakano, Kanagawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 24 days.

(21) Appl. No.: 10/645,437

(22) Filed: Aug. 20, 2003

(65) Prior Publication Data

US 2004/0038434 A1 Feb. 26, 2004

Related U.S. Application Data

(62) Division of application No. 10/067,553, filed on Feb. 4, 2002, now Pat. No. 6,790,697, which is a division of application No. 09/027,012, filed on Feb. 20, 1998, now Pat. No. 6,403,986, which is a division of application No. 08/534,333, filed on Sep. 27, 1995, now Pat. No. 5,783,844.

(30) Foreign Application Priority Data

| Sep. 28, 1994 | (JP) | ............................................ 6/232808 |
| Dec. 22, 1994 | (JP) | ............................................ 6/320341 |
| Dec. 27, 1994 | (JP) | ............................................ 6/324755 |

(51) Int. Cl.[7] ............................................ H01L 21/00
(52) U.S. Cl. ............................ 438/34; 438/41; 438/44; 438/503
(58) Field of Search ............................ 438/41, 44, 31, 438/34, 481, 503, 507, 800

(56) References Cited

U.S. PATENT DOCUMENTS

| 3,425,879 | A | * | 2/1969 | Mehal et al. ................ 438/412 |
| 4,335,501 | A | * | 6/1982 | Wickenden et al. .......... 438/28 |
| 4,764,246 | A | * | 8/1988 | Bridges et al. ............... 438/41 |
| 4,788,159 | A | * | 11/1988 | Smith .......................... 438/43 |
| 4,946,802 | A | * | 8/1990 | Shima et al. ................. 438/40 |
| 5,089,437 | A | * | 2/1992 | Shima et al. ................. 438/40 |
| 5,094,973 | A | * | 3/1992 | Pang .......................... 438/424 |
| 5,104,824 | A | * | 4/1992 | Clausen et al. ............... 438/34 |
| 5,250,462 | A | * | 10/1993 | Sasaki et al. ................. 438/24 |
| 5,346,854 | A | * | 9/1994 | Ahn et al. .................... 438/33 |
| 5,397,740 | A | * | 3/1995 | Toyoda et al. ............... 438/41 |
| 5,587,335 | A | * | 12/1996 | Mori et al. ................... 438/29 |

\* cited by examiner

Primary Examiner—Amir Zarabian
Assistant Examiner—Christy Novacek
(74) Attorney, Agent, or Firm—Blakely Sokoloff Taylor & Zafman

(57) ABSTRACT

An optical semiconductor device includes an optical semiconductor element, a semiconductor region, and a buried layer. The optical semiconductor element is formed on a semiconductor substrate. The semiconductor region opposes the optical semiconductor element and essentially surrounds the optical semiconductor element to form walls. The buried layer is arranged between the walls of the semiconductor region and the optical semiconductor element and formed by vapor phase epitaxy. In this optical semiconductor device, a distance between the wall of the semiconductor region and a side wall of the optical semiconductor element is larger in a portion in which the growth rate of the vapor phase epitaxy in a horizontal direction from the side wall of the optical semiconductor element and the wall of the semiconductor region is higher.

2 Claims, 28 Drawing Sheets

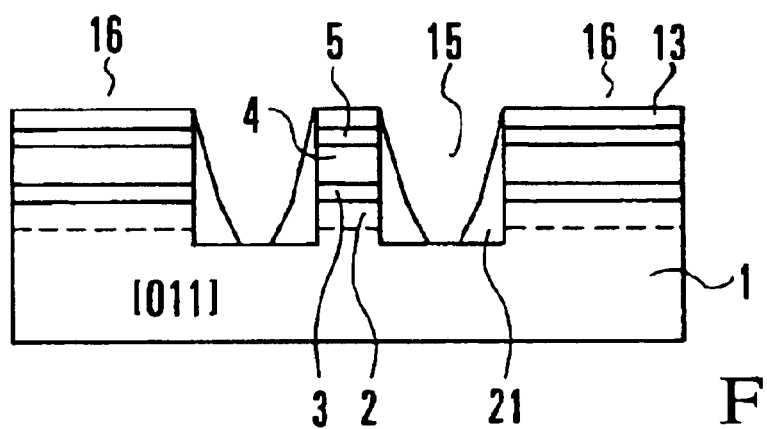
F I G. 2A
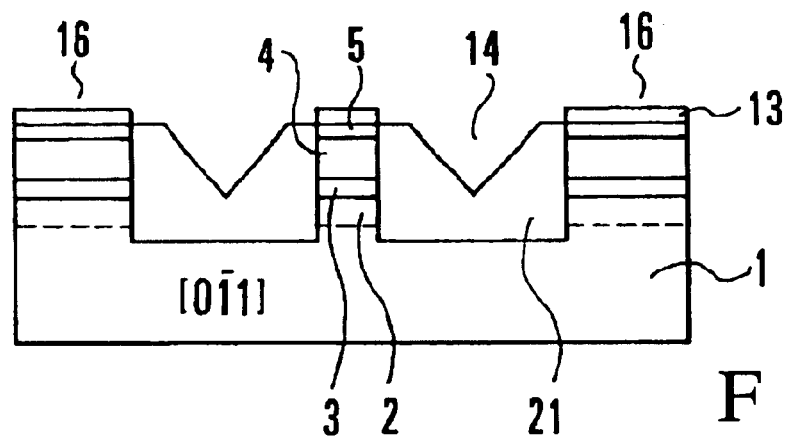
F I G. 2B

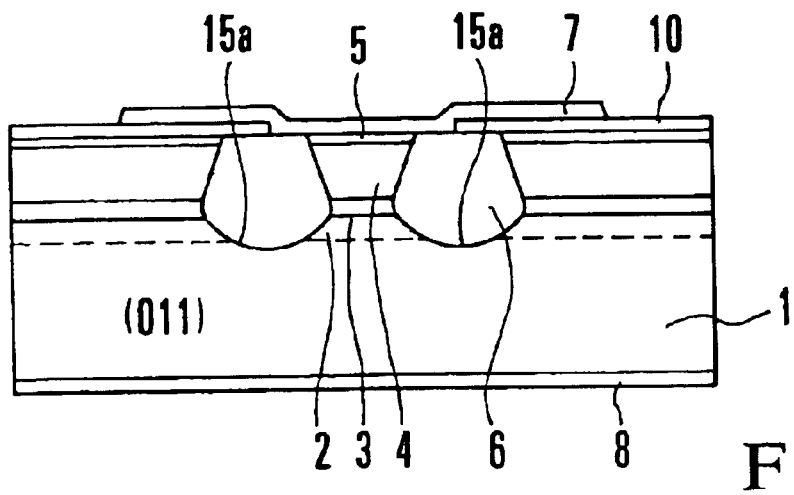
F I G. 6A
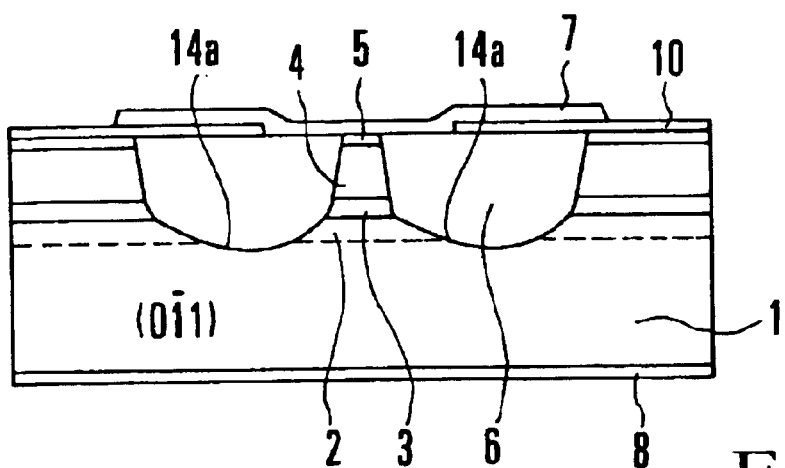
F I G. 6B
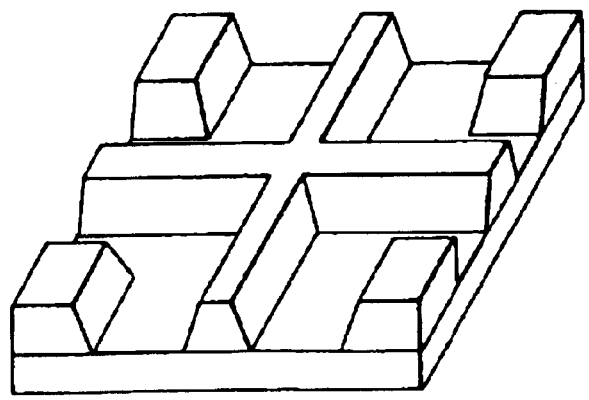
F I G. 6C

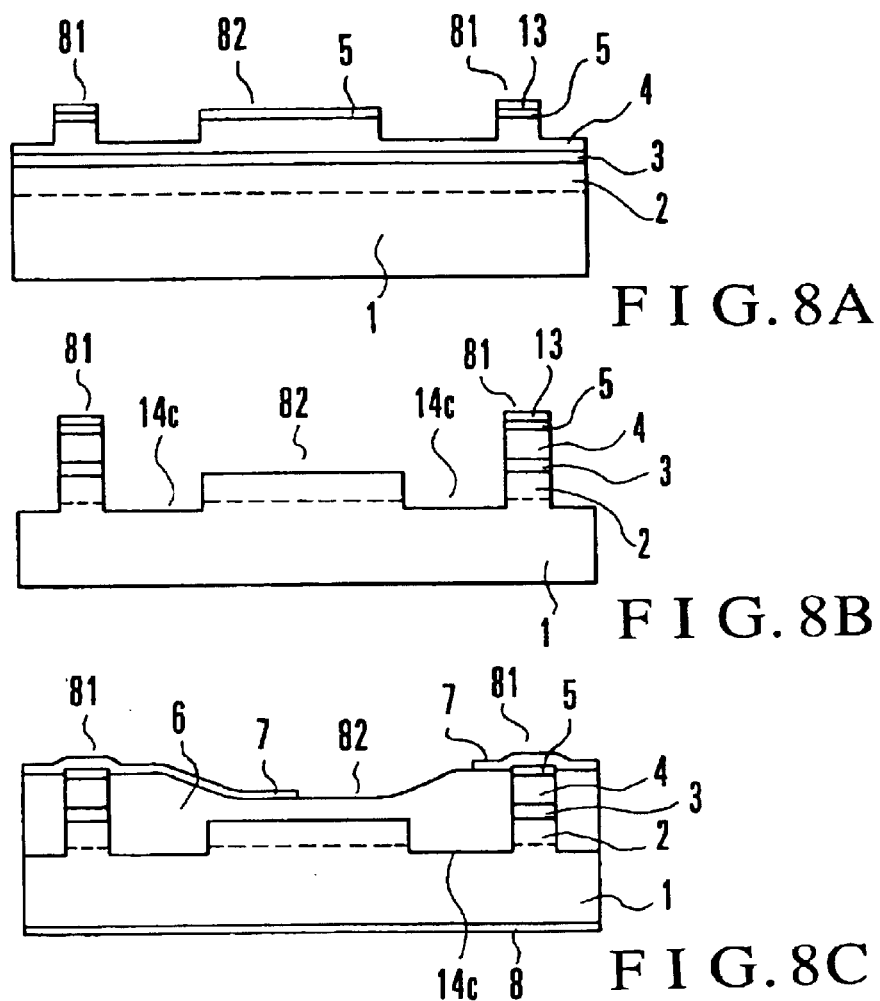
FIG. 8A
FIG. 8B
FIG. 8C
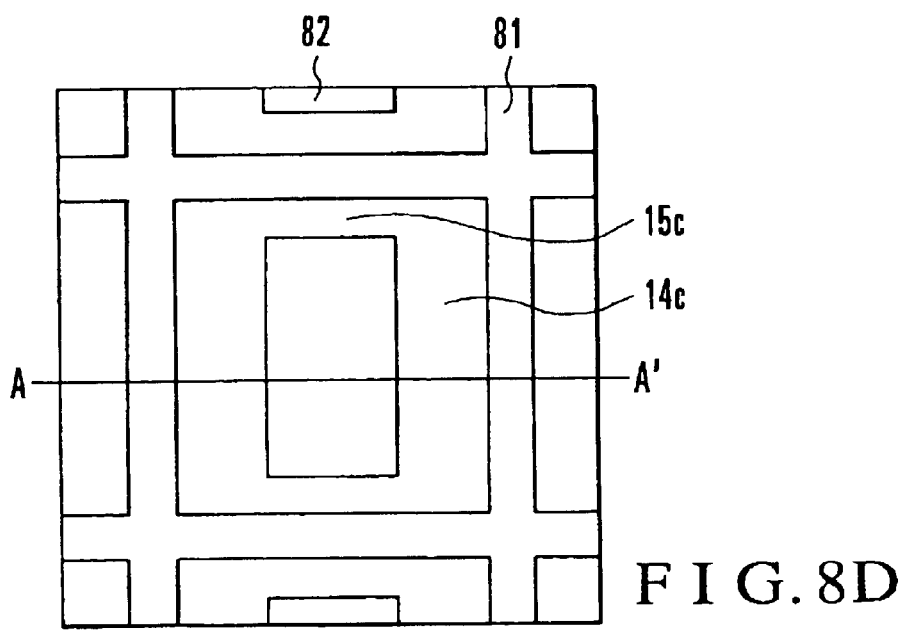
FIG. 8D

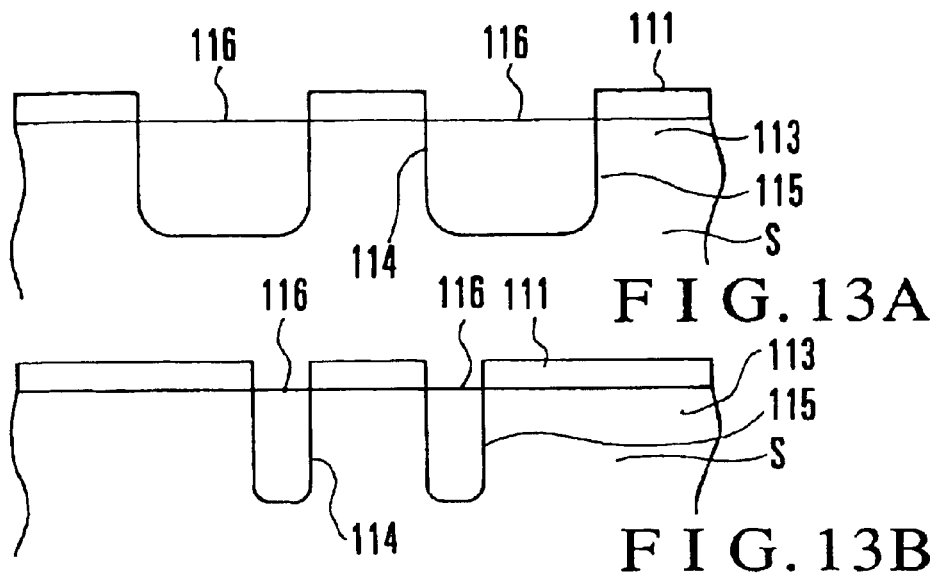
F I G. 13A
F I G. 13B
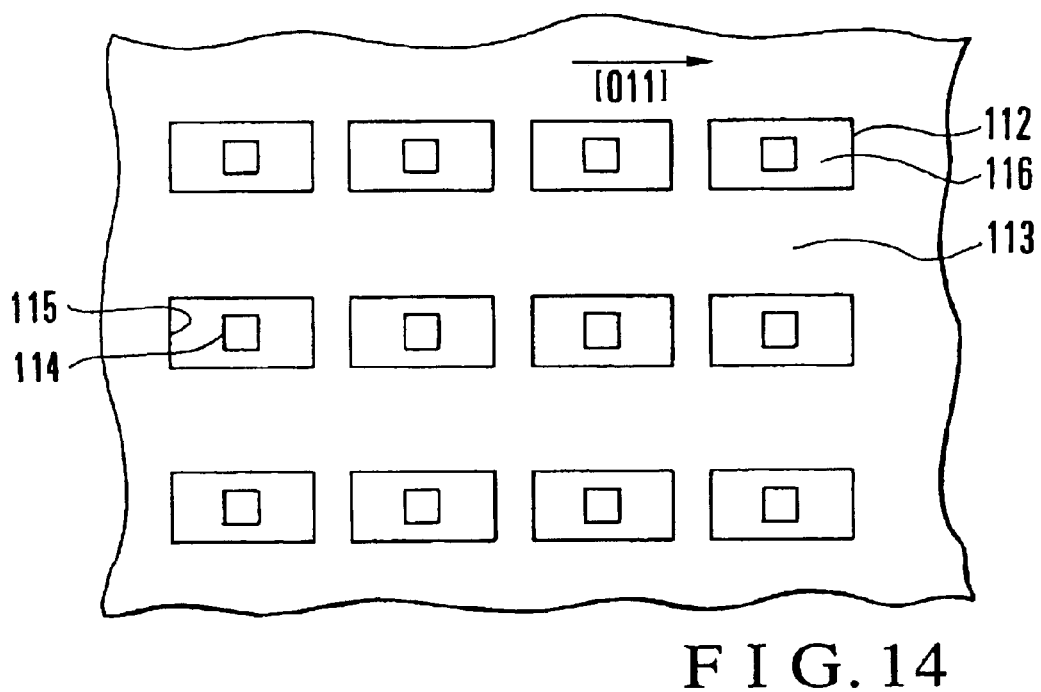
F I G. 14
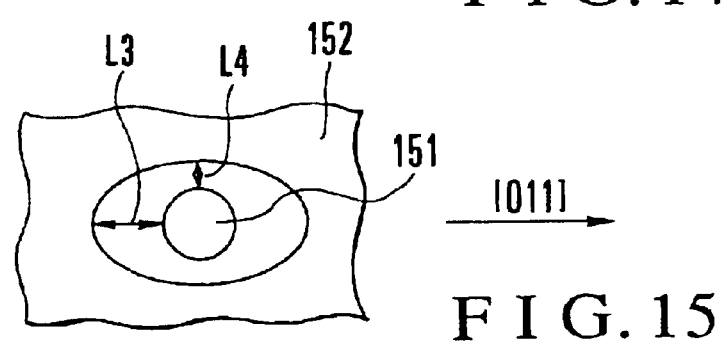
F I G. 15

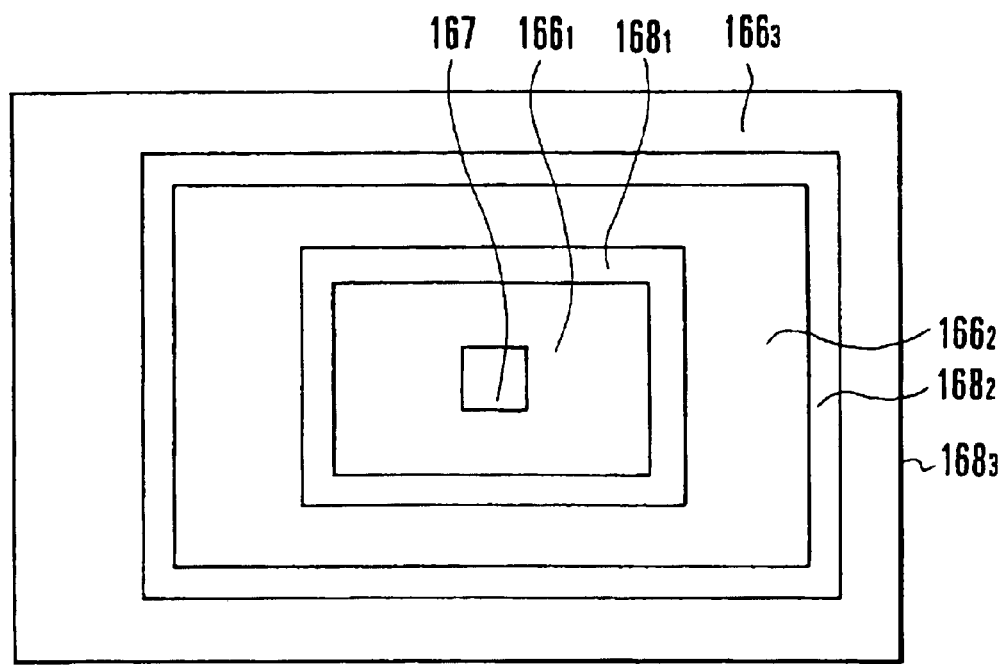
F I G. 16
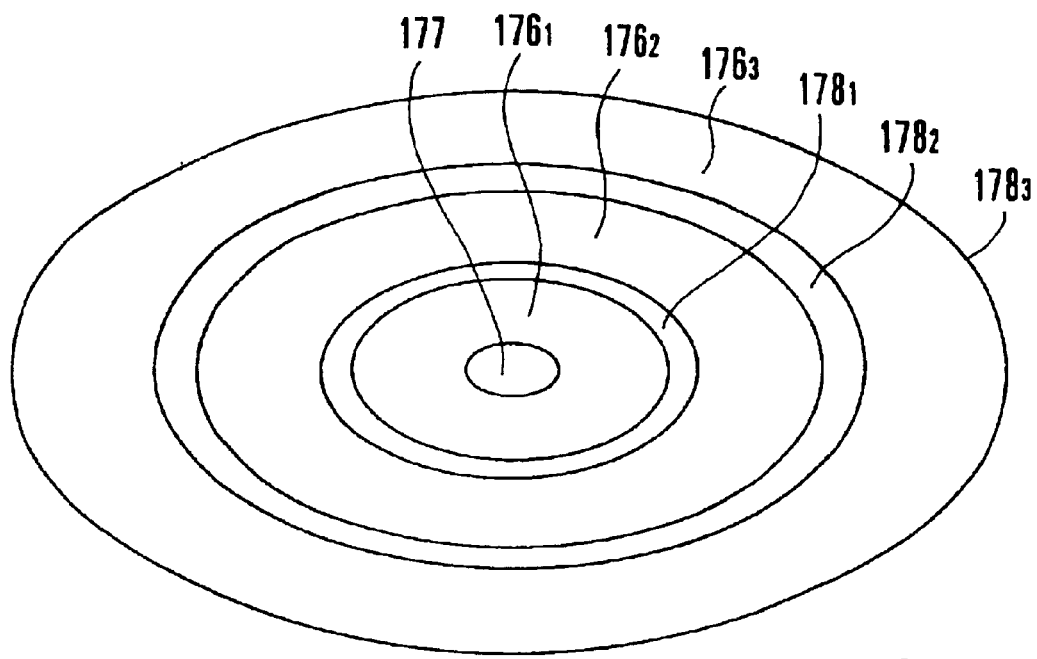
F I G. 17

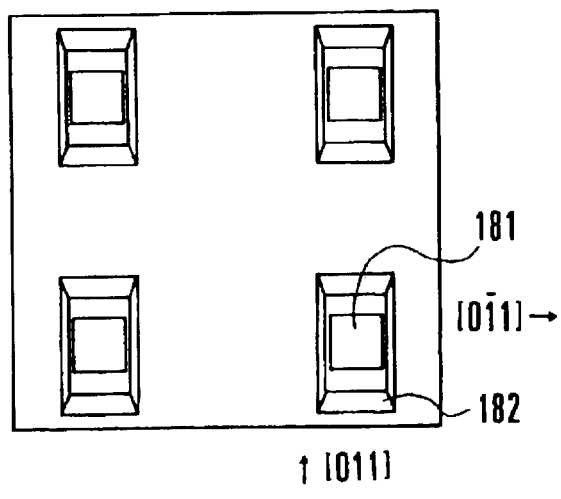
F I G. 18A
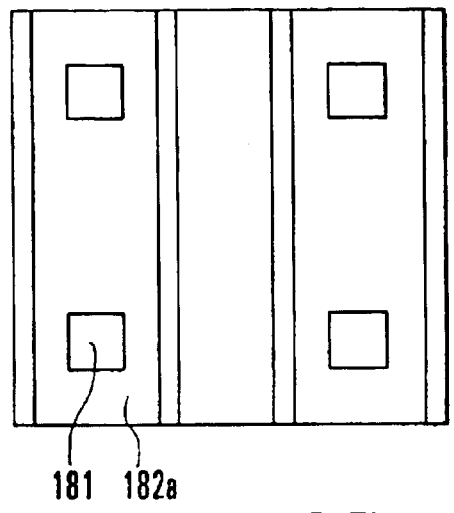
F I G. 18C
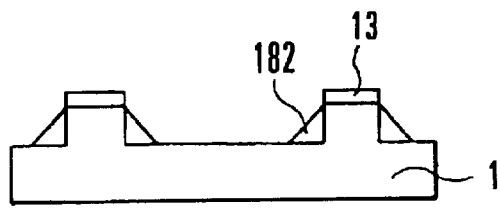
F I G. 18B
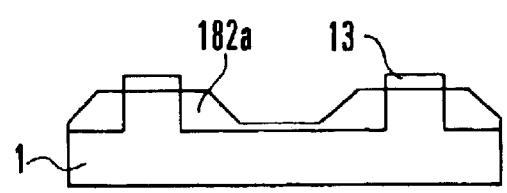
F I G. 18D

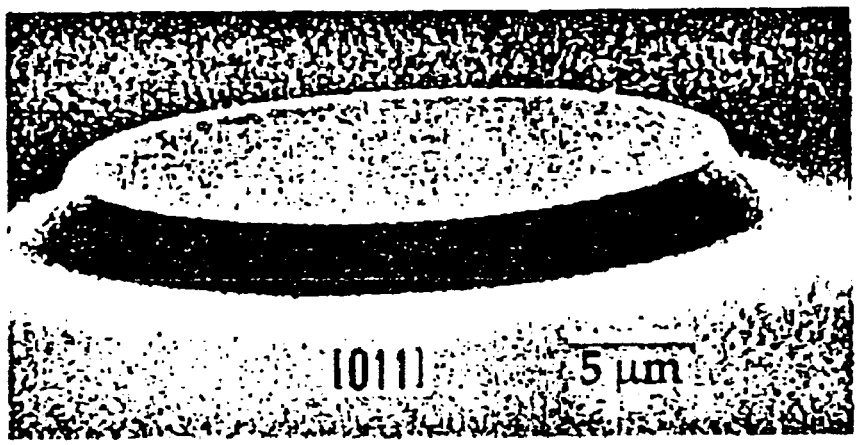
COLUMNAR MESA ETCHED TO DEPTH OF
3mm USING Br-METHANOL (0°C, 1%)
F I G. 34A
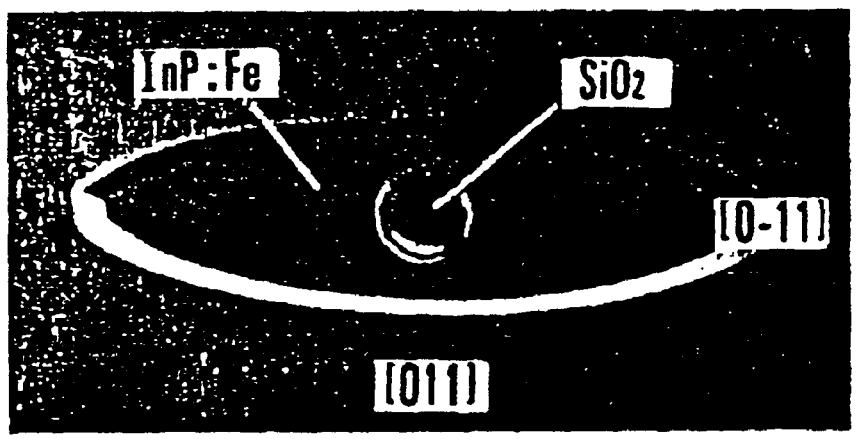
AFTER SAME MESA AS ABOVE WAS
BURIED AND GROWN
F I G. 34B

US 6,949,394 B2

OPTICAL SEMICONDUCTOR DEVICE AND METHOD OF FABRICATING THE SAME

This application is a Divisional of application Ser. No. 10/067,553 filed on Feb. 4, 2002, now U.S. Pat. No. 6,790,697 which is a divisional of application Ser. No. 09/027,012 filed Feb. 20, 1998, now U.S. Pat. No. 6,403,986, which is a divisional of application Ser. No. 08/534,333 filed on Sep. 27, 1995, now U.S. Pat. No. 5,783,844 issued Jul. 21, 1998.

BACKGROUND OF THE INVENTION

The present invention relates to an optical semiconductor device and a method of fabricating the same and, more particularly, to an optical semiconductor device having a semi-insulating buried heterostructure wherein an optical integrated circuit consisting of a plurality of waveguides or an optical integrated circuit obtained by adding an electronic device thereto is formed by using a high resistive semi-insulating semiconductor, the optical semiconductor device being represented by an optical cross switch such as a side-light injection type bistable laser or a directional coupler, and a method of fabricating the same.

GaInAsp/InP semiconductor lasers have a basic arrangement in which a layer structure near a light emission region is a double heterostructure consisting of a $Ga_{1-x}In_xAs_yP_{1-y}$ active layer about 100 nm thick and p- and n-type InP layers (cladding layers). These cladding layers vertically sandwich the active layer and have a larger band gap than that of the active layer.

Due to effective carrier confinement by this double heterostructure, in th active layer of the double heterostructure, it is possible to form excitation carriers at a high density (up to $10^{18}$ cm$^{-3}$) upon energization at a relatively low current density (1 to 10 kA/cm$^2$).

Also, the refractive index of a cladding layer having a large forbidden band is generally smaller than that of an active layer. The double heterostructure uses this refractive index difference to form an optical waveguide in the direction of thickness, confining laser light in the vicinity of the active layer.

A semiconductor laser having this double heterostructure with the above properties can continuously oscillate at room temperature, so the double heterostructure is used as a common basic structure of practical semiconductor lasers.

Furthermore, in practical semiconductor lasers, various stripe structures are used in the horizontal direction parallel to the p-n junction surface to give the lasers the waveguide properties of confining a current or injected carriers into a stripe region in that direction, thereby stabilizing the transverse mode of oscillated laser light.

This stripe active region is sometimes buried in a cladding layer region having a larger forbidden band. The result is a buried heterostructure (BH) in which the double heterostructure is also formed in the horizontal direction.

In this buried heterostructure, carriers are also confined in the horizontal direction, resulting in an increased current injection efficiency.

Furthermore, a two-dimensional optical waveguide is formed by the refractive index difference between the active layer and the cladding region in which the active layer is buried. Consequently, it is possible to obtain a fundamental transverse mode semiconductor laser with a high efficiency and a stable oscillation mode.

One example of the means of forming a buried layer to obtain a buried heterostructure is HVPE (Hydride (Chloride) Vapor Phase Epitaxy) which makes use of a difference from thermal equilibrium by using a nitrogen- or hydrogen-diluted gas mixture of a Group V gas, such as $PH_3$ or $PCl_3$, and a Group III gas of, e.g., a metal halide (InCl) formed by a thermo-chemical reaction with HCl.

MOVPE (Metal Organic Vapor Phase Epitaxy) is also available in which a gasified (diluted) organic metal (primarily of Group III) is crystal-grown together with a Group V gas ($PH_3$) by substrate heating.

Alternatively, the temperature of a solution containing a semiconductor material is decreased by bringing the solution into contact with the substrate surface. Consequently, the liquid phase in the boundary region supersaturates and precipitates (crystal-grows) on the substrate. This method is called LPE (Liquid Phase Epitaxy).

FIGS. 29A and 29B are schematic cross-sectional views showing the arrangements of semiconductor lasers having an SIBH (Semi-Insulating Buried Hetero) structure formed by selectively burying semi-insulating InP using HVPE.

This semiconductor laser is fabricated as follows.

First, an n-type InP cladding layer 2 is crystal-grown on an n-type InP substrate 1 of (001) orientation by using MOCVD or MBE (Molecular Beam Epitaxy). Examples of the dopant for obtaining n-type are Se, Si, and S.

Subsequently, an active layer 3 is formed on top of the structure.

This active layer 3 consists of a guide layer (light confining layer) made from, e.g., undoped or n-type-doped InGaAsP, an active layer formed on the guide layer and made from undoped InGaAsP, and a guide layer formed on the active layer and made from undoped or p-type-doped InGaAs.

Subsequently, a p-type InP overcladding layer 4 is formed on the active layer 3. Examples of the dopant for obtaining a p-type layer are Zn and Be.

A p-type InGaAs or InGaAsP electrode contacting layer 5 is then formed on the overcladding layer 4. This electrode contacting layer 5 is formed to obtain an ohmic contact (and to decrease the contact resistance) with an electrode (to be described later).

An InP layer is sometimes formed on the electrode contacting layer 5 to protect the electrode layer or increase the adhesion of a mask material. However, no such layer is used in this structure.

Subsequently, a stripe pattern (not shown) made from silicon oxide is formed on the electrode contacting layer 5 by photolithography and etching. This stripe pattern is used as a mask to perform etching to a portion below the active layer, forming a stripe etching mesa.

A semi-insulating InP buried layer 6 is then formed to bury the both sides of the etching mesa by using Fe as a dopant. This formation is done by HVPE as described above.

A p-type electrode 7 consisting of an Au—Zn—Ni alloy is formed on the buried layer 6, and an n-type electrode consisting of an Au—Ge—Ni alloy is formed on the lower surface of the substrate 1. Consequently, a semiconductor laser with the structure shown in FIG. 29A is formed.

Note that as the p-type electrode 7, a Ti—Pt—Au alloy can also be Schottky-connected in some instances.

FIG. 29B is a sectional view showing the arrangement of a semiconductor laser formed using an overcladding layer 4a and an electrode contacting layer 5a both increased in area to increase the injection efficiency of carriers into an active layer 3.

In FIG. 29B, reference numeral 9 denotes an n-type InP current blocking layer for suppressing a recombination current with captured electrons resulting from injection of holes from the overcladding layer 4a into a semi-insulating layer 6; and 10, an insulating layer made from silicon oxide or silicon nitride. The rest of the arrangement is similar to that in FIG. 29A.

Note that the current blocking layer 9 is usually formed using the same growth apparatus (e.g., an MOCVD or MOVPE apparatus) as for the p-type overcladding layer 4a.

On the other hand, as a semiconductor laser in which a buried layer is formed by LPE or MOCVD (MOVPE), semiconductor lasers having a p-n buried structure are available in which, as illustrated in FIGS. 30A and 30B, conductive carriers are confined by forming a p-n junction barrier.

In the structure shown in FIG. 30A, the both sides of a cladding layer 2 and an active layer 3, as an etching mesa, are buried with a p-type InP current blocking layer 11 and an n-type InP current blocking layer 12 by using LPE or MOCVD. Thereafter, a p-type overcladding layer 4a is grown.

FIG. 30B is a sectional view showing the arrangement of a semiconductor laser with a DCPBH (Double Channel Planar Buried Hetero) structure.

In this structure, an etching mesa is not singly formed; that is, an etching mesa consisting of a buffer layer 2 and an active layer 3 is formed by forming trenches.

These trenches are buried with current blocking layers 11a and 12a.

Note that the same reference numerals as in FIGS. 29A and 29B denote the same portions in FIGS. 30A and 30B.

Also, as with the waveguide lasers described above, vertical resonator type surface emission lasers which vertically emit a laser light from the substrate surface must also have the buried structure to improve the performance.

FIG. 31 is a sectional view showing the major components of a surface emission laser with a GaAs buried structure.

As shown in FIG. 31, this surface emission laser has a cylindrical active region 301 and two reflecting mirrors 302 parallel to each other in the vertical direction. These reflecting mirrors 302 have a DBR (Distributed Bragg Reflector) structure.

The active region 301 is processed into a cylindrical mesa structure 303 by a chemical etching solution and buried with a buried layer 304 formed by LPE.

The buried layer 304 has a pnp structure, and so a current in the transverse direction is blocked.

In FIG. 31, reference numerals 310 and 311 denote cladding layers; 312, a diffused region; 313, an electrode; 314, a buffer layer; 315, a GaAs substrate; and 316, an electrode.

In burying the cylindrical or square active region in this surface emission laser with the above arrangement, the conventional approach is to etch the entire region except for the region to be buried and bury that region using epitaxy such as LPE.

Recently, however, the burying technique using semi-insulating InP has been developed and is beginning to be used as described earlier.

Burying with this semi-insulating InP can improve the performance of a laser, e.g., can increase the modulation rate and decrease the oscillation threshold value.

The application of this technique is expected to improve the performance of surface emission lasers and other surface type optical elements, as well as waveguide lasers.

Unfortunately, the above conventional structures have the following problems.

First, the formation of the SIBH structure using VPE described above is restricted by the structure of a waveguide (etching mesa) to be buried.

As an example, in the formation of a buried layer using MOVPE, the burying of a waveguide extending in the (011) direction is common.

If, however, this is used to bury a waveguide, such as a crossed waveguide or a surface type optical element, having a structure with two or more combinations of different orientations, the reaction site differs from one orientation to another. As a result, around a waveguide in the ($0\bar{1}1$) direction, an abnormal growth such as an overhang readily occurs on the waveguide. This makes flat burying growth impossible.

On the other hand, such an abnormal growth hardly occurs in HVPE since HVPE is a thermal equilibrium process. However, the orientation dependence of the growth rate significantly appears near a regrowth temperature of 650° C. That is, growth in the transverse direction becomes dominant. Accordingly, a slow-growing (001) face is formed in the regrowth process, and this forms a flat surface.

FIGS. 32A and 32B are perspective views showing the arrangement of a crossed waveguide in which a waveguide whose side surfaces are in the (011) direction and a waveguide whose side surfaces are in the ($0\bar{1}1$) direction cross each other.

In FIGS. 32A and 32B, reference numeral 6b denotes a buried layer being grown; and 13, a selective growth mask made from silicon oxide. The rest of the structure is analogous to that shown in FIGS. 29A and 29B.

In this structure, the crystal growth rate of the buried layer 6b in the (011) direction is greatly different from that in the ($0\bar{1}1$) direction; the crystal growth rate around the waveguide in the ($0\bar{1}1$) direction is very high.

The present inventors have also found that the growth rate around the waveguide in the (011) direction, in which the growth rate is originally low, is further lowered in the crossed structure when compared with that in the (011) direction due to mass-transport of a reactant (INCl) and a by-product (HCl) in a surface reaction rate-determining process (kinetic control) under near-equilibrium system.

Consequently, when the both sides of this crossed waveguide are buried with a buried layer, a portion around the waveguide in the (011) direction is not much buried as illustrated in FIG. 32B.

In contrast, the waveguide in the ($0\bar{1}1$) direction is easily covered with the buried layer, making it difficult to perform flat burying growth even with HVPE.

Vertical resonator type surface emission lasers also have the problem of difficulty in flat burying growth, because the side walls of these lasers consist of a large number of orientations.

FIGS. 33A to 33C are views for explaining a method of burying square mesa structures by using HVPE described previously. FIG. 33A is a plan view, FIG. 33B is a sectional view taken along the (011) direction, and FIG. 33C is a sectional view taken along the ($0\bar{1}1$) direction.

No flat surface can be obtained as described above since the growth in the horizontal direction from side walls 335 of a buried mesa structure 333 is faster than the growth in the vertical direction from a bottom surface 336 and since the growth rate changes in accordance with the orientation of the side walls 335.

On the other hand, the formation of a p-n buried structure using LPE has the problems of, e.g., the production of a junction capacitance and the production of a leakage current from the burying interface, and the limitations on the depth of burying for obtaining a pnp layered structure.

Additionally, LPE has a high processing temperature of 700° C. or more, and this degrades the performance of buried elements.

SUMMARY OF THE INVENTION

It is, therefore, a principal object of the present invention to provide an optical semiconductor device having a buried heterostructure with a flat surface and a method of fabricating the same.

To achieve the above object according to an aspect of the present invention, there is provided an optical semiconductor device comprising an optical semiconductor element formed on a semiconductor substrate, a semiconductor region opposing the optical semiconductor element and essentially surrounding the optical semiconductor element to form walls, and a buried layer arranged between the walls of the semiconductor region and the optical semiconductor element and formed by vapor phase epitaxy, wherein a distance between the wall of the semiconductor region and a side wall of the optical semiconductor element is larger in a portion in which a growth rate of the vapor phase epitaxy in a horizontal direction from the side wall of the optical semiconductor element and the wall of the semiconductor region is higher.

According to another aspect of the present invention, there is provided an optical semiconductor device comprising a plurality of optical semiconductor elements formed on a semiconductor substrate, a dummy portion formed in a center of a square at four corners of which the optical semiconductor elements are arranged, and a buried layer formed by vapor phase epitaxy so as to bury a portion between the optical semiconductor elements and the dummy portion.

According to still another aspect of the present invention, there is provided a method of fabricating an optical semiconductor device, comprising the first step of forming an optical semiconductor element on a semiconductor substrate, the second step of forming a semiconductor region having walls opposing the optical semiconductor element and essentially surrounding the optical semiconductor element, and the third step of forming a buried layer by vapor phase epitaxy between the walls of the semiconductor region and the optical semiconductor element, wherein in the second step, a distance between the wall of the semiconductor region and a side wall of the optical semiconductor element is larger in a portion in which a growth rate of the vapor phase epitaxy in a horizontal direction from the side wall of the optical semiconductor element and the wall of the semiconductor region is higher.

According to still another aspect of the present invention, there is provided a method of fabricating an optical semiconductor device, comprising the steps of forming a plurality of optical semiconductor elements on a semiconductor substrate, forming a dummy portion in a center of a square at four corners of which the optical semiconductor elements are arranged, and forming a buried layer by vapor phase epitaxy so as to bury a portion between the optical semiconductor elements and the dummy portion.

The optical semiconductor device of the present invention comprises an optical semiconductor element formed on a semiconductor substrate, a semiconductor region opposing the optical semiconductor element and essentially surrounding the optical semiconductor element to form walls, and a buried layer arranged between the walls of the semiconductor region and the optical semiconductor element and formed by vapor phase epitaxy.

A distance between the wall of the semiconductor region and a side wall of the optical semiconductor element is determined in accordance with the growth rate of vapor phase epitaxy which is determined by the directions, which are perpendicular to the orientation of the semiconductor substrate, of the side wall of the optical semiconductor element and the wall of the semiconductor region, and by the orientation of the semiconductor substrate.

Accordingly, in the optical semiconductor device consisting of the optical semiconductor element having side surfaces different in direction, the distance between the side wall of the optical semiconductor element and the wall of the semiconductor region is determined in relation to the growth rate of the buried layer. As a result, the buried layer is formed flat.

Also, the optical semiconductor device of the present invention comprises a plurality of optical semiconductor elements formed on a semiconductor substrate, a dummy portion formed in the center of a square at the four corners of which the optical semiconductor elements are arranged, and a buried layer formed by vapor phase epitaxy so as to bury a portion between the optical semiconductor elements and the dummy portion.

Accordingly, the buried layer is formed by growth from the side surfaces of the dummy portion in addition to growth from the surface of the semiconductor substrate and from the side surfaces of the optical semiconductor elements.

The method of fabricating an optical semiconductor device according to the present invention comprises the first step of forming an optical semiconductor element on a semiconductor substrate, the second step of forming a semiconductor region having walls opposing the optical semiconductor element and essentially surrounding the optical semiconductor element, and the third step of forming a buried layer by vapor phase epitaxy between the walls of the semiconductor region and the optical semiconductor elements.

In the second step, a distance between the wall of the semiconductor region and a side wall of the optical semiconductor element is determined in accordance with the growth rate of vapor phase epitaxy which is determined by the directions, which are perpendicular to the orientation of the semiconductor substrate, of the side wall of the optical semiconductor element and the wall of the semiconductor region, and by the orientation of the semiconductor substrate.

Accordingly, in the optical semiconductor device consisting of the optical semiconductor element having side surfaces different in direction, the distance between the side wall of the optical semiconductor element and the wall of the semiconductor region is determined in relation to the growth rate of the buried layer. As a result, the buried layer is formed flat.

BRIEF DESCRIPTION OF THE DRAWINGS

FIGS. 2A and 2B are sectional views for explaining the method of fabricating the optical semiconductor device as the first embodiment of the present invention;

FIGS. 6A to 6C are sectional views showing the arrangement of an optical semiconductor device according to the second embodiment of the present invention;

FIGS. 8A to 8D are sectional views showing a method of fabricating an optical semiconductor device as the fourth embodiment of the present invention;

FIGS. 13A and 13B are sectional views showing a method of burying a mesa structure for explaining another embodiment of the semiconductor device fabrication method;

FIG. 14 is a plan view showing the state in which a plurality of the mesa structures in FIGS. 13A and 13B are arranged;

FIG. 15 is a plan view for explaining another method of burying a mesa structure in the semiconductor device fabrication method of the present invention;

FIG. 16 is a plan view showing a method of burying a mesa structure for explaining still another embodiment of the semiconductor device fabrication method of the present invention;

FIG. 17 is a plan view showing a method of burying a mesa structure for explaining still another embodiment of the semiconductor device fabrication method of the present invention;

FIGS. 18A to 18D are plan and sectional views showing the arrangement of an optical semiconductor device during the fabrication, in which an array of a plurality of optical elements is formed;

FIG. 34A is a scanning electron micrograph showing the surface condition of a formed portion for explaining the growth state of a buried layer in the present invention; and FIG. 34B is a scanning electron micrograph showing the surface condition of the formed portion for explaining the growth state of the buried layer in the present invention.

DETAILED DESCRIPTION OF THE PREFERRED EMBODIMENTS

The first embodiment of the present invention will be described in detail below with reference to the accompanying drawings.

First Embodiment

FIGS. 1A to 1C, 2A and 2B, and 5A and 5B are a plan view and sectional views for explaining a method of fabricating an optical semiconductor device as the first embodiment of the present invention.

Figure 1A:
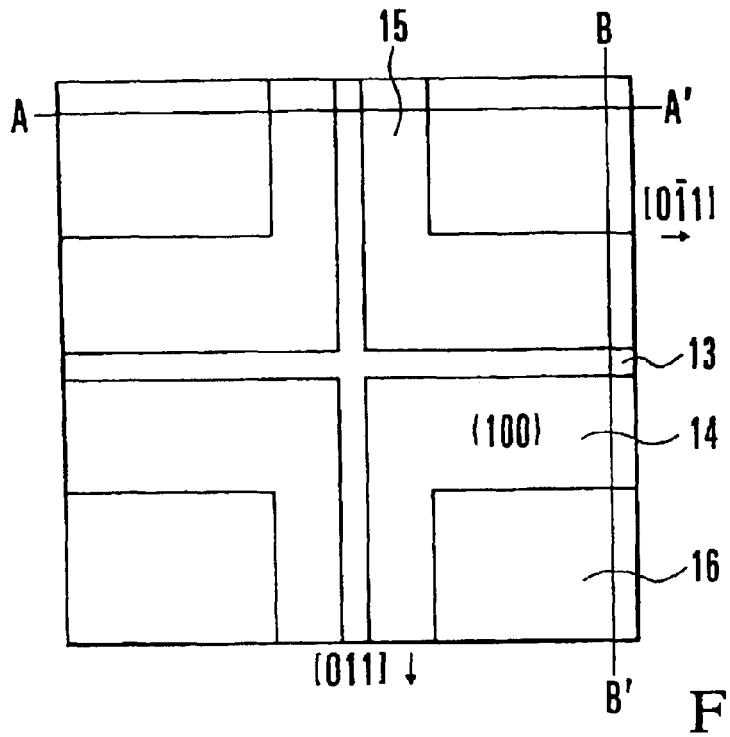
FIGS. 1A to 1C are a plan view and sectional views for explaining a method of fabricating an optical semiconductor device as the first embodiment of the present invention.
Figure 1B:
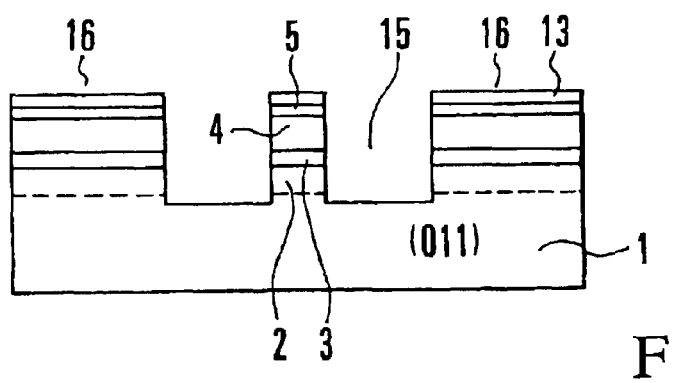
Figure 1C:
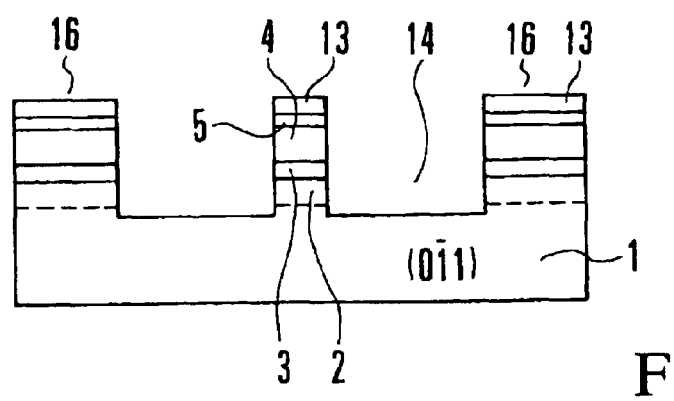
Figure 32A:
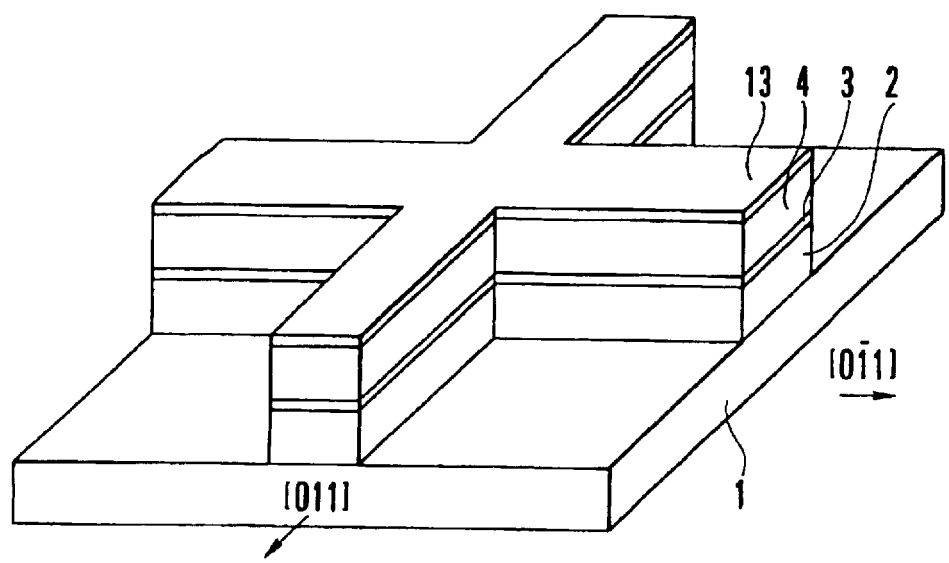
FIGS. 32A and 32B are perspective views for explaining a conventional semiconductor laser fabrication method.
Figure 32B:
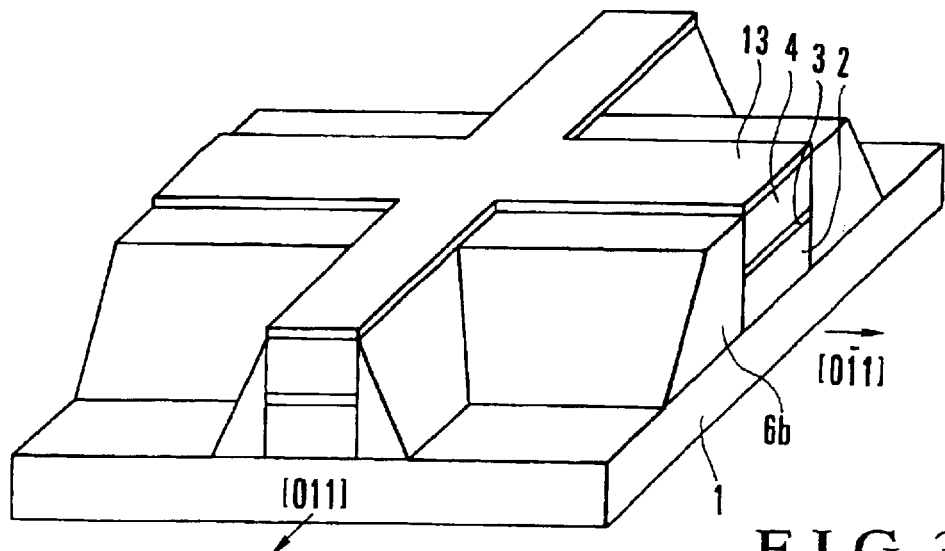

In FIGS. 1A, 1B, and 1C, reference numeral 13 denotes a silicon oxide selective growth mask formed by photolithography and etching; 14, a trench whose side walls are in the (011) direction; 15, a trench whose side walls are in the ($0\bar{1}1$) direction; and 16, a dummy portion (a semiconductor region for forming walls). The rest of the arrangement is analogous to that shown in FIG. 32. That is, the trench 14 extends in the ($0\bar{1}1$) direction, and the trench 15 extends in the (011) direction.

FIG. 1B is a sectional view taken along the line A–A' in the ($0\bar{1}1$) direction, and FIG. 1C is a sectional view taken along the line B–B' in the (011) direction.

Note that the orientation of a substrate 1 is (001).

Although not shown, the selective growth mask 13 may be formed after an InP layer is formed on an electrode contacting layer 5.

With this arrangement, it is possible to protect the electrode contacting layer 5 and improve the adhesion of the selective growth mask 13.

In FIGS. 1A to 1C, stripe portions containing an active layer 3 between the trenches 14 and 15 serve as waveguides. Side walls opposing the side walls of these stripe portions are the walls of this stripe optical semiconductor element.

Note that the plan view and the sectional views are not at the same scale.

Figure 29A:
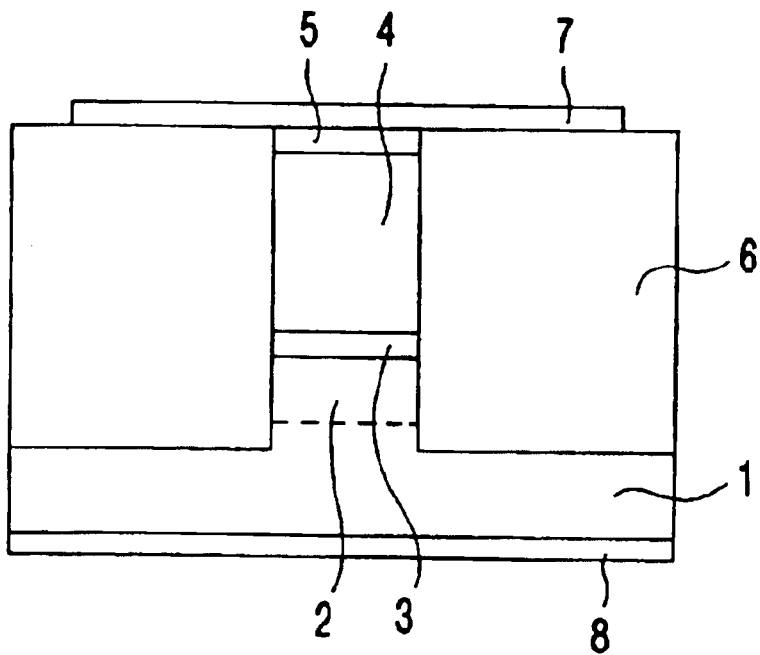
FIGS. 29A and 29B are sectional views showing the arrangements of conventional semiconductor lasers.
Figure 29B:
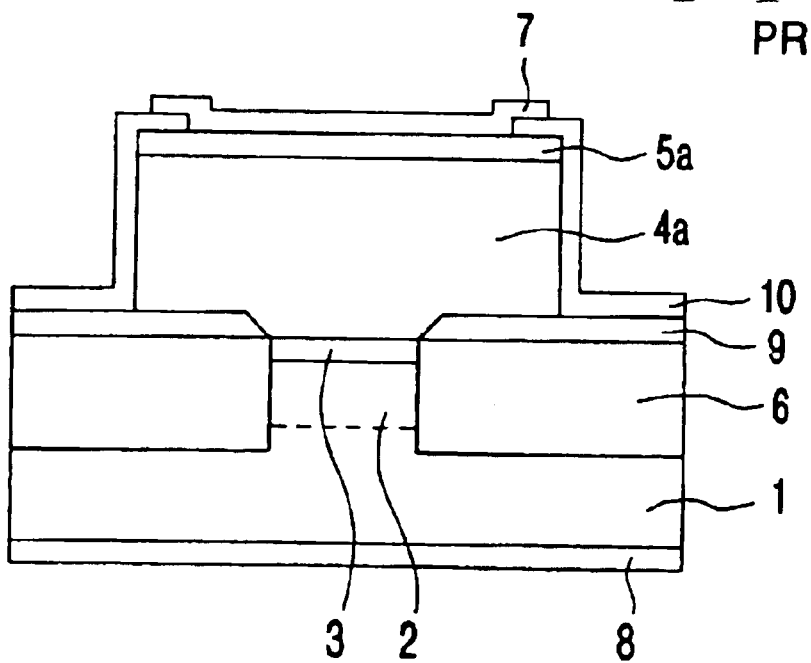
Figure 30A:
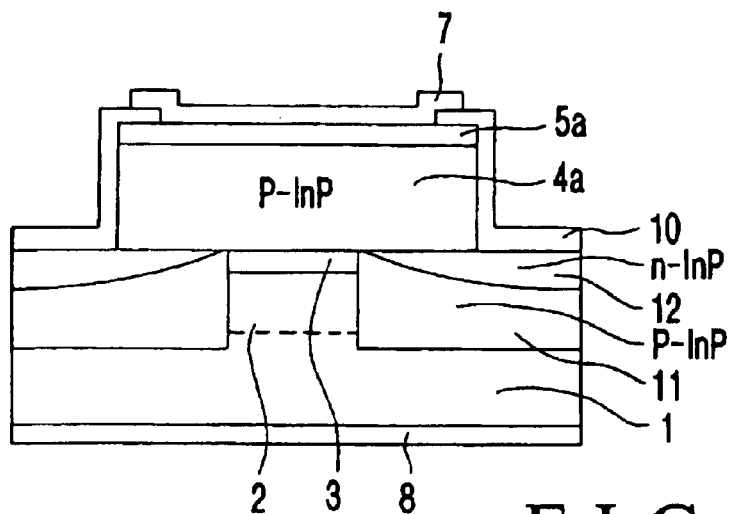
FIGS. 30A and 30B are sectional views showing the arrangements of conventional semiconductor lasers.
Figure 30B:
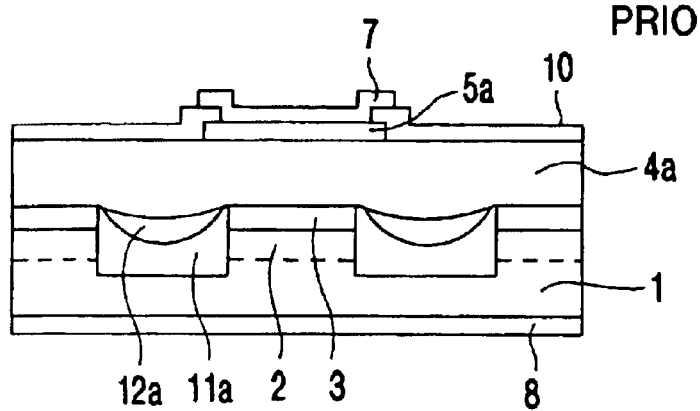
Figure 31:
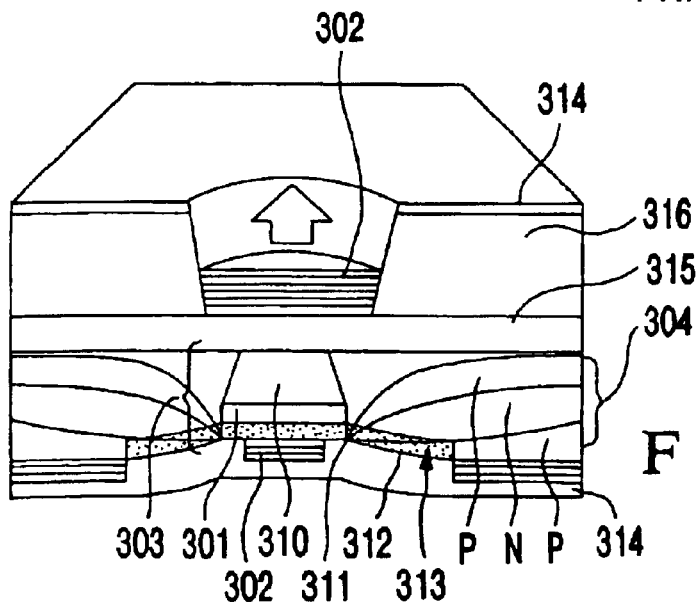
FIG. 31 is a sectional view showing the arrangement of a conventional semiconductor laser.

In this embodiment, layers up to the electrode contacting layer 5 are first formed as in the conventional semiconductor lasers illustrated in FIGS. 29A and 29B.

Subsequently, the selective growth mask 13 made from silicon oxide is formed on the electrode contacting layer 5 and used as a mask to selectively etch the electrode contacting layer 5, an overcladding layer 4, the active layer 3, a cladding layer 2, and the substrate 1.

This etching is done by reactive ion etching using a plasma which is formed by performing RF glow discharge for a hydrocarbon gas such as methane gas or thane gas, or a halogen gas such as bromine gas or chlorine gas.

Note that in this first embodiment, the etching is so performed as to leave the dummy portion 16, and the trench 14 is made wider than the trench 15.

The carbon decomposition product adhered to the side and bottom surfaces of the trenches 14 and 15 by this etching treatment is removed by a dry process using oxygen plasma and a wet process using sulfuric acid, thereby cleaning the etched surfaces.

As a result, as shown in FIGS. 1A, 1B and 1C, the trench 14 having the side surfaces perpendicular to the (011) direction is made wider, and the trench 15 having the side surfaces whose direction perpendicular to the orientation of the substrate 1 is the ($0\bar{1}1$) direction is made narrower. In this state, the waveguides sandwiched between the trenches 14 and 15 are formed to cross each other in the ($0\bar{1}1$) and (011) directions.

Subsequently, as illustrated in FIGS. 2A and 2B, InP 21 is crystal-grown in the trenches 14 and 15 by using HVPE.

In this crystal growth, a Group V element gas such as $PH_3$ or $PCl_3$ and a Group III element gas such as InCl are used as source gases, and a chloride (ferrous chloride: $FeCl_2$) of Fe is mixed to dope Fe. InCl and $FeCl_2$ are produced by placing In and Fe in a high-temperature region and supplying HCl to that region. HCl is diluted with nitrogen and used as a carrier.

The partial pressure of the Group V element gas is controlled to be higher than the partial pressure of the Group III element gas, and thereby the growth mode is rate-determined by InCl as a Group III compound even in the system in which different orientations, such as (111)A and (111)B surfaces, are mixed. Consequently, the crystal growth in the horizontal direction from the side surfaces of the trenches 14 and 15 is made dominant. Additionally, the efficiency at which Fe, which is activated in the reaction site of the Group III element, is incorporated is increased, and the growth in the (001) orientation of the substrate 1 is relatively suppressed.

The doped Fe forms the ground state of deep acceptors at a position of about –0.6 eV from the bottom of the conduction band in the bad gap of InP.

Additionally, InP is made semi-insulating by activating Fe at $1\times10^{17}$ $cm^{-3}$ at which injected electrons are well captured, even now the background carrier concentration in an undoped state, resulting from an n-type impurity incorporated during the growth, to an order of $1\times10^{15}$ $cm^{-3}$ or lower, thereby compensating it.

As a consequence, the Fe-doped InP 21 is crystal-grown from the side surfaces of the trenches 14 and 15, and there by the trenches 14 and 15 are buried.

As shown in FIGS. 2A and 2B, on the side surfaces of the trench 14 of which the side walls 1 are perpendicular to the (011) direction, a so-called A-surface system (primarily a (113) A surface) in which the surface is terminated by In during regrowth appears. Therefore, on the side surfaces of the trench 14 the growth of the InP 21 is made faster by the surface reaction rate-determination than on the side surfaces of the trench 15 of which the side walls are perpendicular to the ($0\bar{1}1$) direction, i.e., in the direction in which a so-called B-surface system (primarily a (113) B surface) in which the surface is terminated by P during regrowth appears.

Also, when growth surfaces having different growth rates are close to each other such as in a crossed waveguide, HCl produced by a thermal equilibrium reaction:

$$PH_3+InCl \rightarrow InP(A\ surface)+H_2+HCl$$

on the growth surface whose growth rate is increased by the kinetic controlled process also diffuses into the slow-growing surface by mass-transport. This suppresses a reaction:

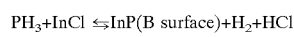

$$PH_3+InCl \leftrightharpoons InP(B\ surface)+H_2+HCl$$

on this slow-growing surface.

Figure 3A:
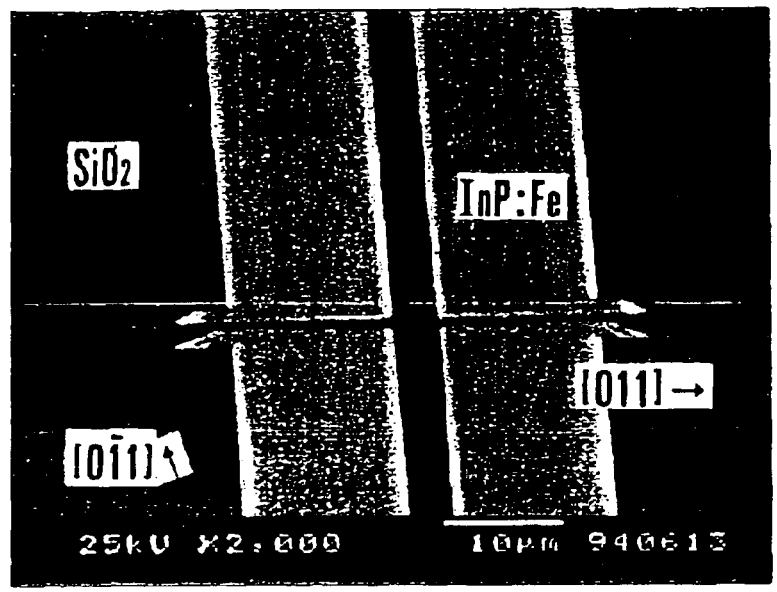
FIGS. 3A and 3B are scanning electron micrographs showing the surface conditions of a buried structure for explaining the method of fabricating the optical semiconductor device as the first embodiment of the present invention.

Consequently, the trench in the ($0\bar{1}1$) direction is buried much faster than the trench in the (011) direction (FIG. 3A).

Figure 3B:
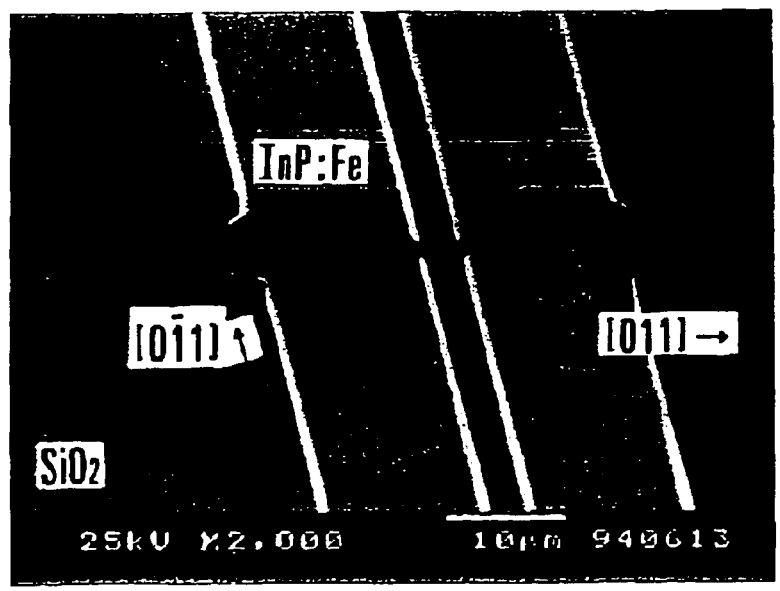

Thereafter, however, the (001) surface appears in the buried trench in the ($0\bar{1}1$) direction. Accordingly, the surface reaction rate-determination process becomes dominant in the B-surface system (particularly the (113) B surface) which appears in the trench in the (011) direction, and supply of HCl from the trench in the ($0\bar{1}1$) direction is also decreased. Therefore, as illustrated in FIG. 3B, the trench in the (011) direction is immediately buried, and this prevents a rise of InP growing in the trench in the ($0\bar{1}1$) direction and serving as a buried layer.

This is so because the trench in the ($0\bar{1}1$) direction corresponding to the trench 14 in FIGS. 2A and 2B is made wider, and this makes it possible to take matching between the kinetic-process described previously and the accompanying mass-transport.

Figure 4A:
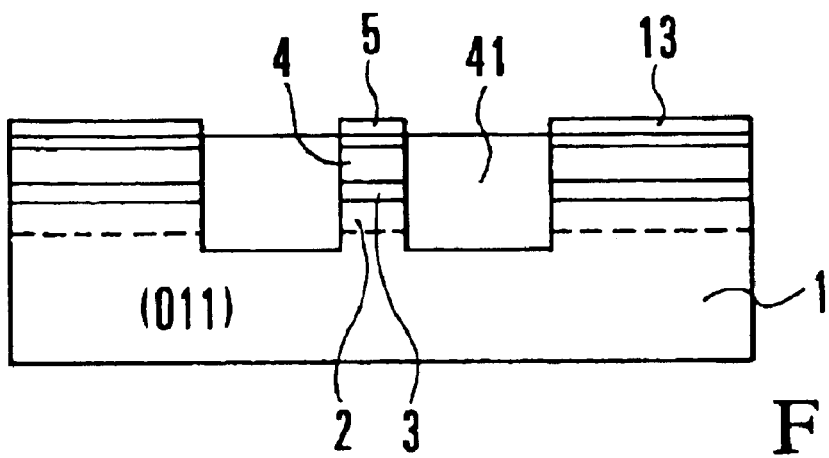
FIGS. 4A and 4B are schematic cross-sectional views in the (011) and (0$\bar{1}$1) direction, respectively, when a crossed waveguide structure, in which the distance between the wall of a semiconductor region and a semiconductor element in the (011) direction equals that in the (0$\bar{1}$1) direction, is grown by burying a semiconductor using HVPE.
Figure 4B:
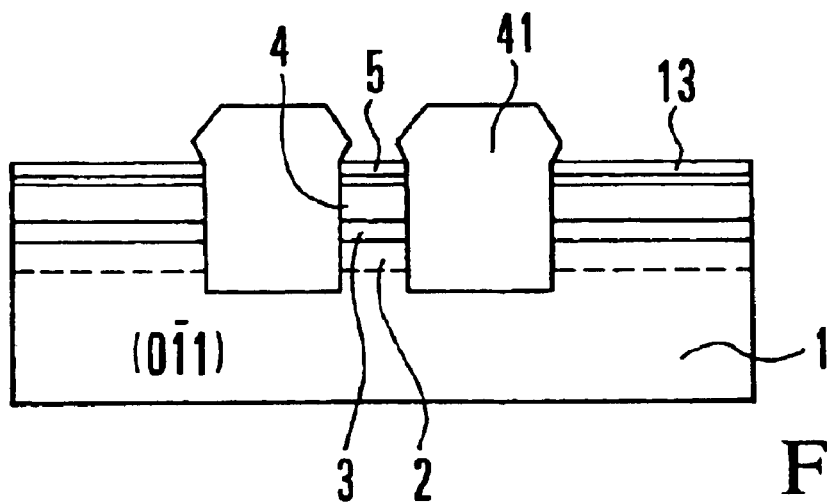

In contrast, if the widths of the two trenches are made equal or almost equal to each other, as shown in FIGS. 4A and 4B, the trench (FIG. 4B) in the (0$\bar{1}$1) direction is buried very fast, and growth occurs even while the trench in the (011) direction which requires a relatively long time is being buried. The result is that growing InP 41 overhangs to impair the flatness.

As described above, according to this embodiment, both the trenches 14 and 15 (FIGS. 2A and 2B) are buried flat.

Thereafter, the insulating film 13 is removed, and an InP layer (not shown), if it is formed on the electrode contacting layer 5, is selectively removed by wet etching. In this wet etching, since only InP is etched away, the buried layer 6 also is slightly etched.

Figure 5A:
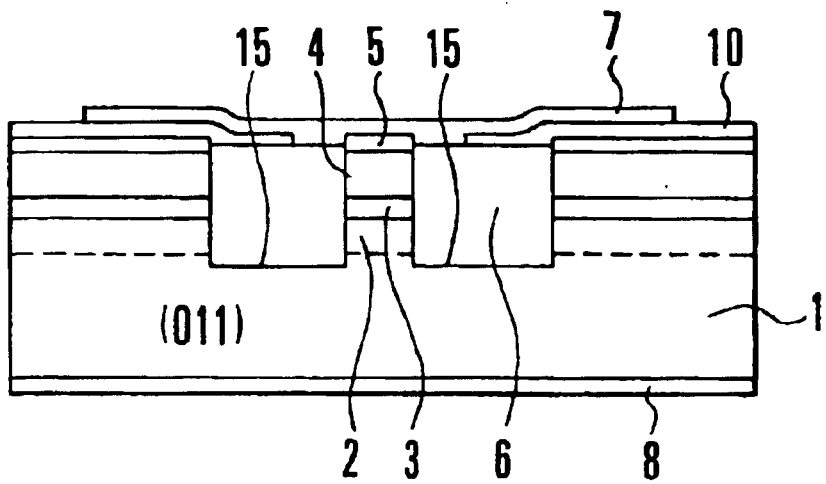
FIGS. 5A and 5B are sectional views for explaining the method of fabricating the optical semiconductor device as the first embodiment of the present invention.
Figure 5B:
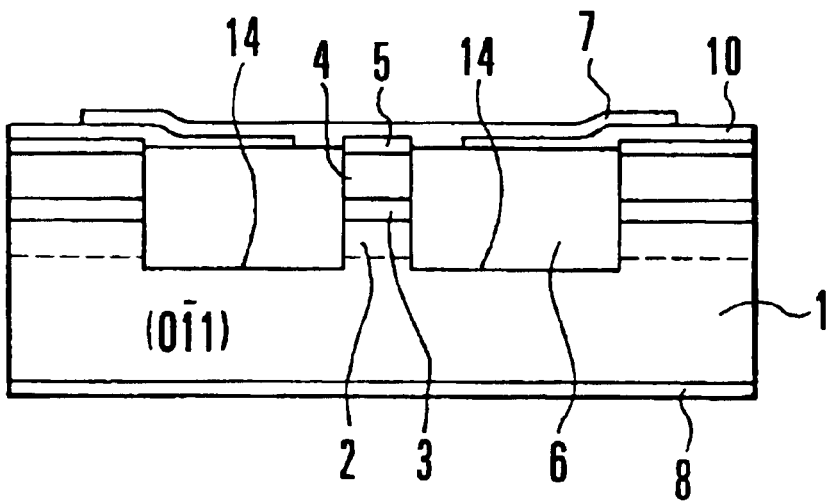

Subsequently, as illustrated in FIGS. 5A and 5B, an insulating film 10 is so formed as to expose the waveguide region containing the buried layer 6. Finally, a p-type electrode 7 is formed by selectively vapor-depositing a metal on the insulating film 10.

Second Embodiment

In the above first embodiment, the trenches in which the buried layer is formed are formed by dry etching (reactive ion etching). However, the present invention is not limited to this embodiment.

That is, these trenches can also be similarly formed by wet etching having no directivity and/or no selectivity (to a semiconductor layer: e.g., InP, InGaAs, or InGaAsP).

FIGS. 6A to 6C are sectional views showing the arrangement of an optical semiconductor device according to the second embodiment of the present invention, in which trenches 14a and 15a are formed by wet etching.

In FIGS. 6A to 6B, reference numerals 14a and 15a denote trenches formed by etching using methanol bromide, and so did another in FIG. 6C using aqueous potassium dichromate solution. The rest of the arrangement is identical with that shown in FIGS. 5A and 5B.

This etching reflects the relationship between the (011) direction and the (100) direction and the relationship between the (0$\bar{1}$1) direction and the (100) direction.

As a result, in the formation of the trench 15a in which the stripe direction is (011), in other words, in which the direction of the side surfaces is the (0$\bar{1}$1) direction in the case of dry etching, a waveguide becomes an inverted as illustrated in FIG. 6A.

On the side walls, a (111) A surface appears from a mask in the upper portion to the substrate, and then a B-surface system in which the (111) surface gradually changes to the (001) surface appears. During regrowth, growth from the (111) A surface first occurs and in the early stages, the inverted changes to a non-inverted whose surface is the B-surface system.

On the other hand, in the formation of the trench 14a in which the stripe direction is (0$\bar{1}$1), in other words, in which the direction of the side surfaces is the (011) direction in the dry etching case, a waveguide becomes a non-inverted as illustrated in FIG. 6B. Since the side walls are terminated by In as previously described in the first embodiment, the growth rate on these walls is very high (kinetic control).

As described above, even when a non-inverted and an inverted are formed on the same substrate in accordance with the directions of formation of stripe waveguides, the trench in which the side surfaces are in the (011) direction is made wider than the trench in which the side surfaces are in the (0$\bar{1}$1) direction. As a consequence, a buried layer 6 is formed flat with no overhang in either trench.

Also, as shown in the perspective view of FIG. 6C, when isotropic dry etching is used in the formation of the trenches, the trench on the side surfaces of which crystal growth occurs faster is made wider for the same reasons as above.

As a consequence, the buried layer for burying waveguides is formed flat in either trench in the same manner as described above.

Third Embodiment

In the above embodiments, crossed waveguides are formed on the same substrate. However, the present invention is not restricted to these embodiments.

That is, these waveguides can also be similarly formed in a matrix form.

Figure 7A:
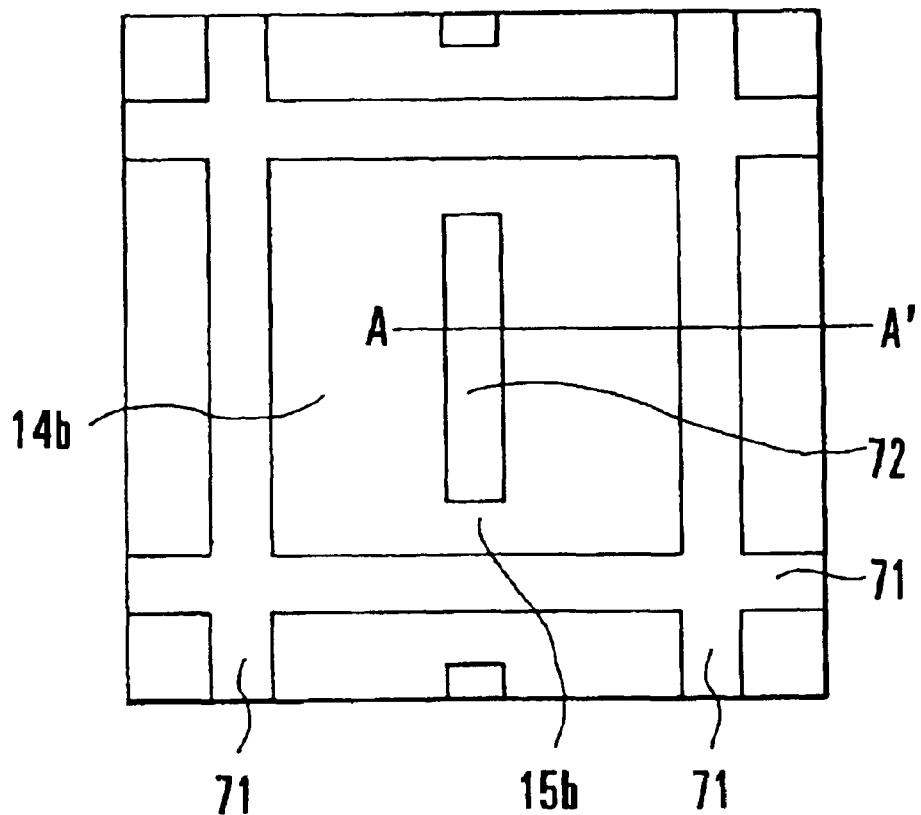
FIGS. 7A and 7B are a plan view and a sectional view, respectively, showing the arrangement of an optical semiconductor device according to the third embodiment of the present invention.
Figure 7B:
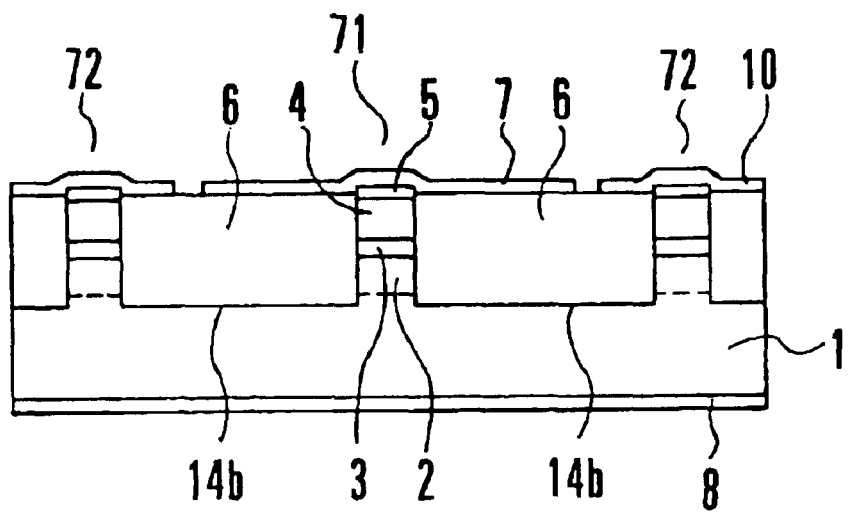

FIGS. 7A and 7B are a plan view and a sectional view, respectively, showing the arrangement of an optical semiconductor device in which waveguides are formed in a matrix form.

FIG. 7B shows the section taken along the line A–A' in FIG. 7A in which a p-type electrode 7 and an insulating film 10 shown in FIG. 7B are not formed. Also, FIGS. 7A and 7B are not at the same scale, and FIG. 7B illustrates a waveguide 71 at the center.

In FIGS. 7A and 7B, reference numeral 14b denotes a trench whose side surfaces are in the (011) direction; 15b, a trench whose side surfaces are in the (0$\bar{1}$1) direction; 71, waveguides; and 72, a dummy portion. The rest of the arrangement is identical with that shown in FIGS. 5A and 5B.

Even in burying the waveguides 71 as in this embodiment, etching is so performed as to leave the dummy portion 72 to thereby form the trenches 14b and 15b in the same way as in the previous embodiments.

As in the above embodiments, the trench 14b is formed to have a width of about 100 μm, i.e., to be wider than the trench 15b. That is, as illustrated in the plan view of FIG. 7A, the dummy portion 72 is formed to be as thin as the waveguides 71.

After the trenches 14b and 15b are formed as described above, a buried layer 6 is formed in the same fashion as in the first embodiment. The insulating film 10 is then so formed as to cover the upper portion of the dummy portion 72, and the p-type electrode 7 is formed in a matrix form so as to be connected to an electrode contacting layer 5.

Fourth Embodiment

In the above third embodiment, in burying the matrix waveguides, the dummy portion analogous to the waveguides is formed in each square of the matrix. However, the present invention is not limited to this.

FIGS. 8A to 8D are sectional views showing a method of fabricating an optical semiconductor device according to the fourth embodiment of the present invention.

FIGS. 8A to 8C show the section taken along the line A–A' of FIG. 8D which illustrates the state corresponding to FIG. 8B. Note that the sectional views and the plan view are not at the same scale.

The fabrication method of this fourth embodiment will be described below.

First, as in the previous embodiments, layers up to an electrode contacting layer 5 are formed as illustrated in FIG. 8A. Subsequently, an insulating film 13 is so formed that waveguides 81 to be formed in a matrix form and a dummy portion 82 to be formed in each square of the matrix are left behind. The insulating film 13 is used as a mask to selectively etch the electrode contacting layer 5 and an overcladding layer 4.

The insulating film 13 on the dummy portions 82 is then selectively removed.

Subsequently, with the insulating film 13 serving as a mask not present on the dummy portions 82, etching is performed again to form the waveguides 81 such that, as illustrated in FIG. 8B, the dummy portions 82 etched away to an active layer 3 are formed in the individual squares of the matrix.

In this structure, a trench 14*c* is made wider than a trench 15*c*.

In this state, InP is deposited to form a buried layer 6*a* under the same conditions as in the first embodiment, and a p-type electrode 7 is formed on the buried layer 6*a* so as to be connected to the electrode contacting layer 5 of the waveguides 81.

According to this embodiment as described above, the buried layer 6 with a gentle slope is formed from the periphery of the waveguide 81 to the formation site of the dummy portion 82, so the dummy portion 82 is buried in the buried layer 6 having semi-insulating properties. Therefore, the dummy portion 82 is not connected to the p-type electrode 7, and this obviates the need for the insulating film 10 shown in FIGS. 5A and 5B, 6A to 6C, and 7A and 7B.

Note that in FIGS. 8A to 8D, the same reference numerals as in FIGS. 7A and 7B denote the same parts.

Fifth Embodiment

The fifth embodiment of the present invention will be described below.

FIGS. 9A to 9D are views showing a schematic arrangement of a directional coupler in which two waveguides 91 and 92 are partially close to each other.

In FIGS. 9A to 9D, reference numerals 93 and 94 denote dummy portions, and the same numerals as in FIGS. 1A to 1C denote the same parts.

The spacing between the close parallel portions of the two waveguides 91 and 92 is as small as 2 μm or smaller to permit propagation of light. However, other regions must confine light.

Figure 9A:
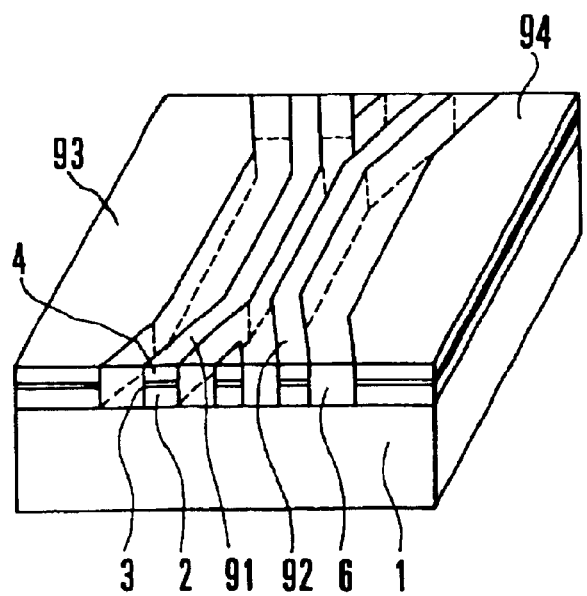
FIGS. 9A to 9D are a perspective view and plan views showing the arrangement of an optical semiconductor device according to the fifth embodiment of the present invention.
Figure 9B:
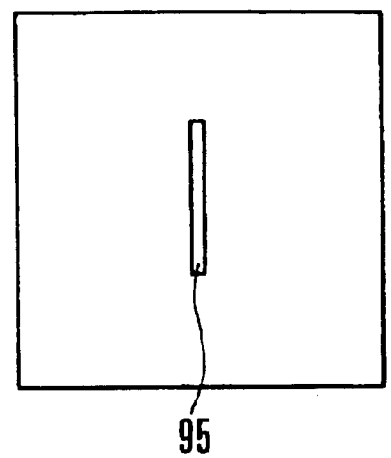

For this purpose, in the formation of this directional coupler, an etching mask having a slit 95 shown in FIG. 9B is first used to form a trench between the parallel portions. After this trench is buried, trenches in other portions are formed. Note that FIGS. 9A, 9C, and 9D show a state in which the trenches are formed between the parallel portions.

In this structure, the direction of the side surfaces of the adjacent parallel portions of the waveguides 91 and 92 is different from that in other portions.

If the direction of the parallel portions in which the waveguides 91 and 92 are close to each other is (011), a B-surface system appears on the side surfaces of the parallel portions during growth as described in the first embodiment, resulting in a low growth rate.

Figure 9C:
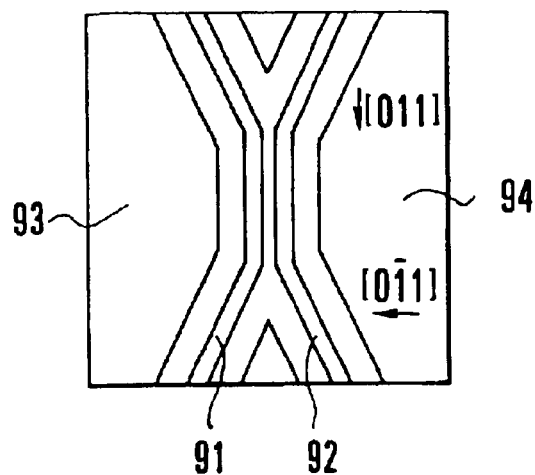
Figure 9D:
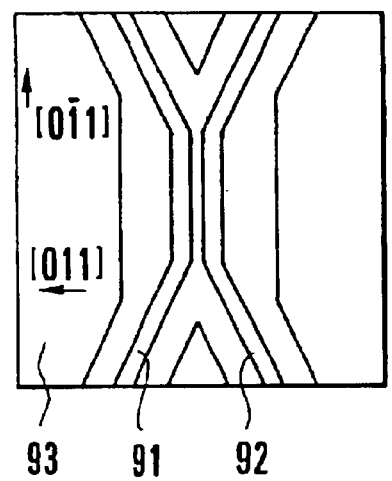

If this is the case, therefore, as illustrated in the plan view of FIG. 9C, the dummy portions 93 and 94 are so formed that the trench width is slightly decreased in the parallel portions.

Note that the methods of forming and burying the trenches for burying growth are analogous to those in the first embodiment.

On the other hand, if the direction of the parallel portions in which the waveguides 91 and 92 are close to each other is ($0\bar{1}1$), an A-surface system. appears on the side surfaces of the parallel portions during growth as described in the first embodiment. The result is that the crystal grows faster.

If this is the case, therefore, as shown in the plan view of FIG. 9D, the dummy portions 93 and 94 are so formed that the trench width is increased in the parallel portions.

Sixth Embodiment

The sixth embodiment of the present invention will be described below.

FIGS. 10A to 10E are a perspective view, plan views, and a sectional view showing the arrangement of an optical semiconductor device having a branching waveguide such as a Mach-Zehnder waveguide according to this sixth embodiment.

In FIGS. 10A to 10E, reference numeral 101 denotes a waveguide which once branches into branching waveguides 101*a* and 101*b* which again merge into a single waveguide.

Reference numeral 102 denotes a dummy portion for the branching waveguide 101*a*; and 103, a dummy portion for the branching waveguide 101*b*. The rest of the arrangement is similar to that shown in FIGS. 9A to 9D.

If the direction of the waveguide 101 is ($0\bar{1}1$), an A-surface system appears on the side surfaces of this portion during growth, with the result that the crystal grows fast on these side surfaces.

Figure 10A:
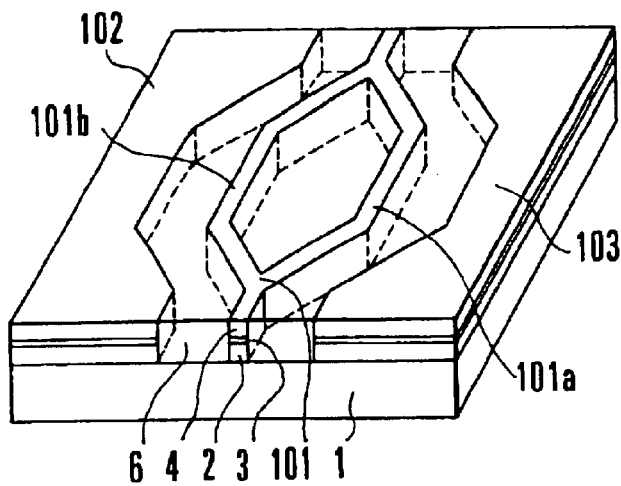
FIGS. 10A to 10E are a perspective view, plan views, and a sectional view showing the arrangement of an optical semiconductor device according to the sixth embodiment of the present invention and the arrangement of the device during the fabrication.
Figure 10B:
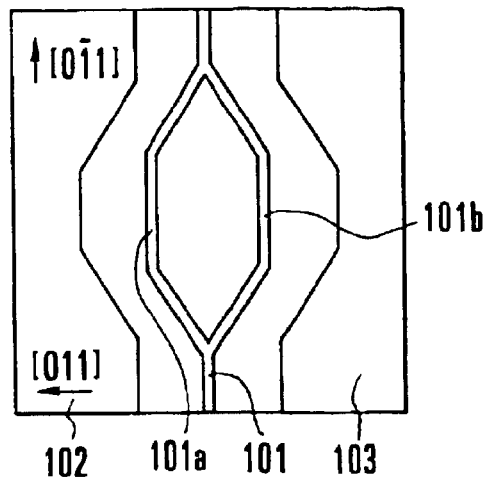

If this is the case, therefore, as shown in the plan view of FIG. 10B, the trench width is increased in the parallel portions.

In portions of the branching waveguides 101*a* and 101*b* in which the direction is not the ($0\bar{1}1$) direction, the direction of the side surfaces is not the (011) direction. Therefore, in these portions the spacing between the dummy portion 102 and the branching waveguide 101*a* and the spacing between the dummy portion 103 and the branching waveguide 101*b* are narrowed.

On the other hand, if the direction of the waveguide 101 is (011), the crystal grows slowly on the sides surfaces of this portion since a B-surface system appears on these side surfaces during growth.

Figure 10C:
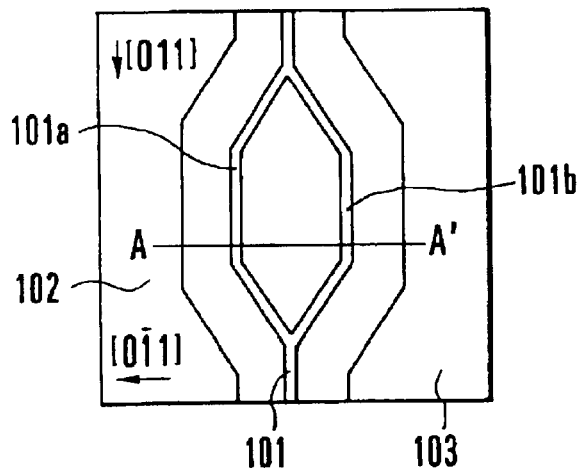
Figure 10D:
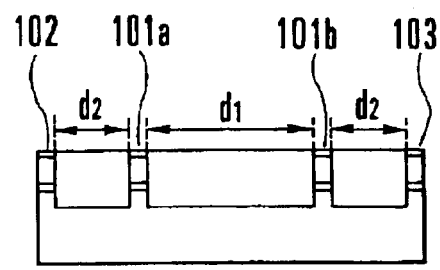

If this is the case, therefore, as illustrated in the plan view of FIG. 10C, the trench width is decreased in the parallel portions.

In portions of the branching waveguides 101*a* and 101*b* in which the direction is not the (011) direction, the side surfaces are not in the ($0\bar{1}1$) direction. Accordingly, in these portions the spacing between the dummy portion 102 and the branching waveguide 101*a* and the spacing between the dummy portion 103 and the branching waveguide 101*b* are widened.

As shown in FIG. 1D which is the sectional view taken along the line A–A'of FIG. 10C, a spacing $d_1$ between the branching waveguides 101*a* and 101*b* is wider than a spacing $d_2$ between the dummy portion 102 and the branching waveguide 101*a* and between the dummy portion 103 and the branching waveguide 101*b*.

Figure 10E:
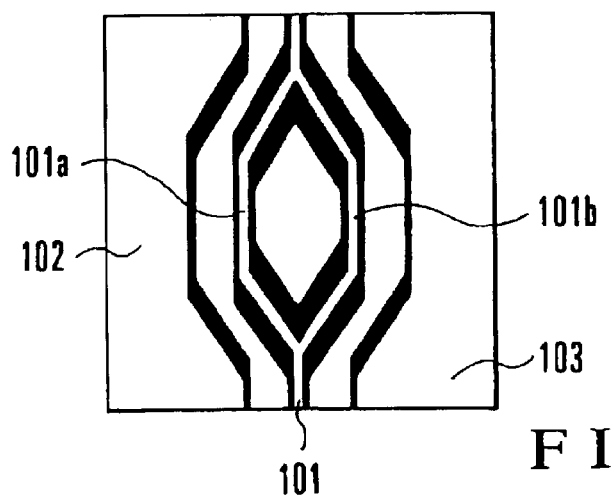

As illustrated in the plan view of FIG. 10E, however, in which FIG. 10E indicates the state of a buried layer 6 during the crystal growth, the portion between the branching waveguides 101*a* and 101*b* is buried faster due to the growth from an oblique portion spreading from the coupled portion of the branching waveguides 101*a* and 101*b*.

For this reason, the spacing $d_1$ is made wider than the spacing $d_2$.

Note that the methods of forming and burying the trenches for burying growth are analogous to those in the first embodiment.

Seventh Embodiment

Figure 11:
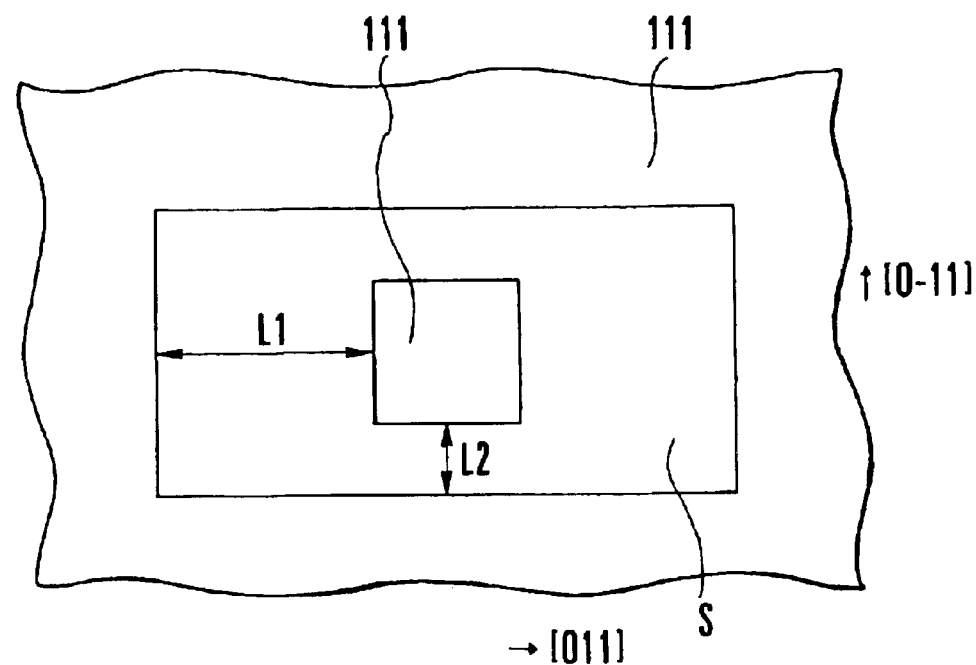
FIG. 11 is a view showing a method of burying a mesa structure for explaining one embodiment of a semiconductor device fabrication method according to the present invention.
Figure 12A:
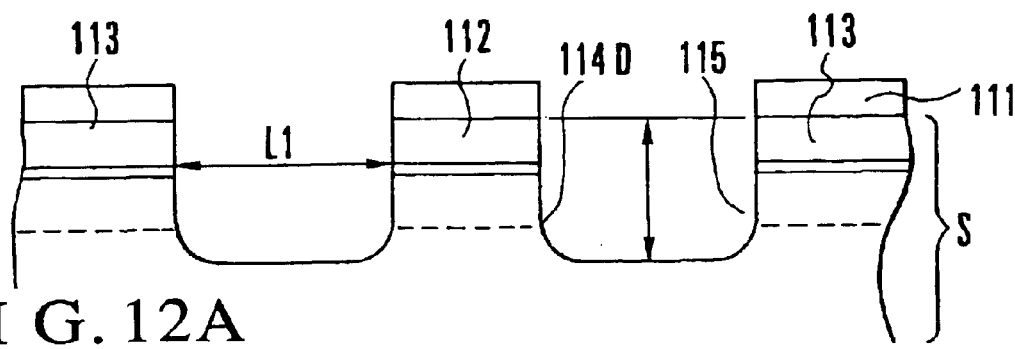
FIG. 12A is a sectional view of the buried mesa structure (FIG. 11) viewed in the (0$\bar{1}$1) direction.
Figure 12B:
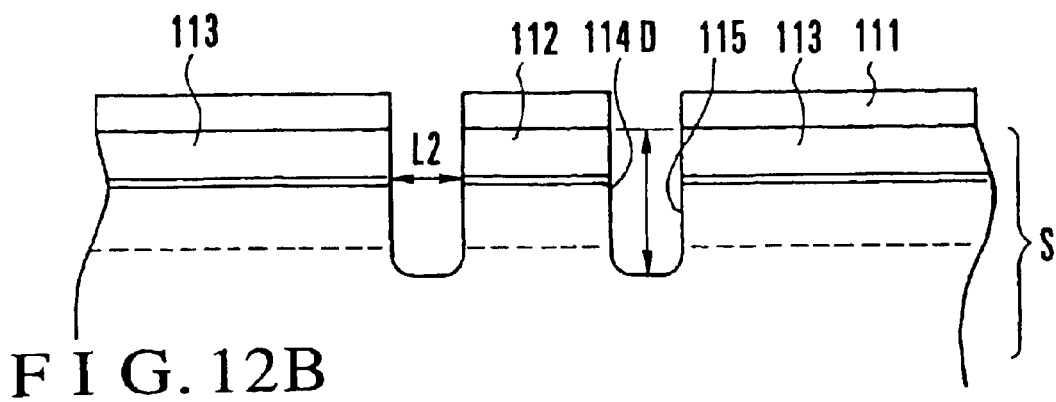
FIG. 12B is a sectional view of the mesa structure viewed in the (011) direction.

FIGS. 11, 12A, and 12B are views for explaining a method of burying a mesa structure in a vertical resonator type surface emission laser, according to the seventh embodiment of the semiconductor device fabrication method of the present invention.

FIG. 11 is a plan view of the major components viewed from the above, FIG. 12A is a sectional view taken along the (011) direction, and FIG. 12B is a sectional view taken along the ($0\bar{1}1$) direction.

Figure 33A:
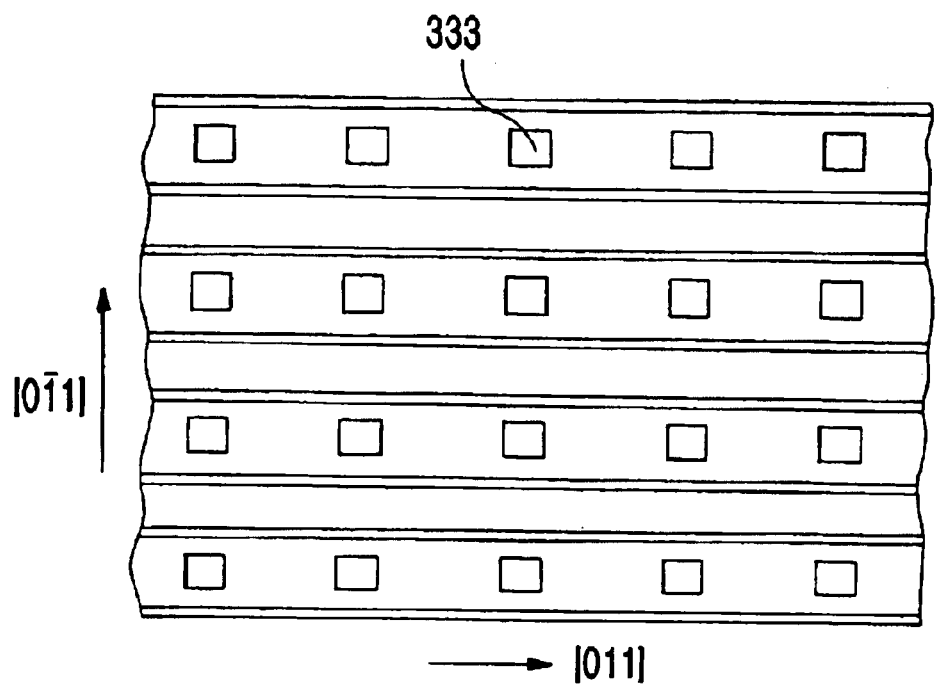
FIGS. 33A to 33C are views for explaining a conventional semiconductor laser fabrication method.
Figure 33B:
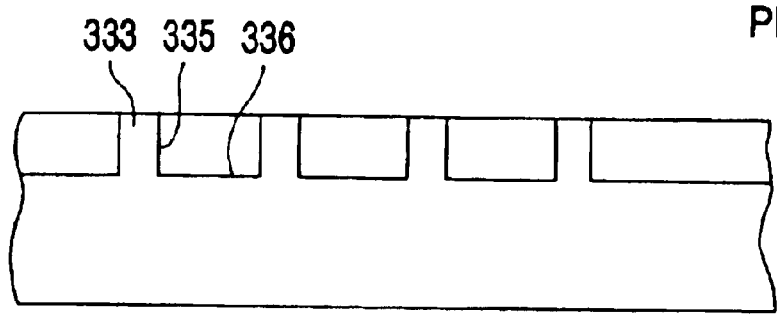
Figure 33C:
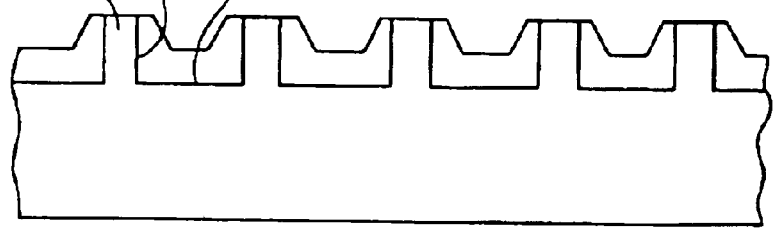

As illustrated in FIGS. 33A to 33C described earlier, in burying an array of a plurality of square mesa structures by using the conventional methods, the growth rate of a buried layer changes in accordance with whether the side walls point in the (011) or ($0\bar{1}1$) direction. The result is that no flat surface can be attained.

In this embodiment, therefore, an optical semiconductor device fabrication method will be described in which walls are formed around a square mesa structure to make it possible to uniformly bury a buried layer and form a flat surface.

This is equivalent to forming the dummy portion 16 (semiconductor region) in FIGS. 1A to 1C so as to surround a square mesa structure.

Note that in this seventh embodiment, it is assumed that a semiconductor used in burying is semi-insulating InP independently of the layered structure of a mesa structure to be buried. Note also that a semiconductor-stacked structure formed on an InP substrate and including an active layer will be simply referred to as a substrate hereinafter.

First, as illustrated in the plan view of FIG. 11, an $SiO_2$ mask 111 having a hole of a predetermined size is formed on the surface of a substrate S having a (001) surface.

Assume the width of the hole of the mask 111 in the (011) direction is larger than the width in the (0$\bar{1}$1) direction. That is, a width L1 in the (011) direction is about 20 μm, and a width L2 in the (0$\bar{1}$1) direction is about 8 μm.

This mask 111 is used as a mask to perform reactive ion etching, described in the first embodiment, for the substrate S, thereby forming a trench about 4 μm in depth D.

Consequently, a square mesa structure 112 and walls 113 surrounding the mesa are formed (FIGS. 12A and 12B). These walls correspond to the dummy portions in FIGS. 1A to 1C.

In this structure, side walls 114 of the mesa structure 112 and side walls 115 of the walls 113 oppose each other. Note that FIG. 12A shows the section viewed in the (0$\bar{1}$1) direction, and FIG. 12B shows the section viewed in the (011) direction.

Subsequently, the mask 111 and the etched surfaces are cleaned by an oxygen plasma ashing process and a sulfuric acid treatment, and Fe-doped InP is grown by HVPE. During the growth, the mask 111 serves as a selective growth mask and the growth time is approximately 16 minutes.

As a result, the trench is buried flat with an InP layer 116 in both the sectional view in the (0$\bar{1}$1) direction of FIG. 13A and the sectional view in the (011) direction of FIG. 13B.

FIG. 14 is a plan view showing the state in which a plurality of the mesa structures 112 buried flat with an InP layer 116 are formed.

Compared to the conventional structure in FIGS. 33A to 33B, the mesa structures 112 are surrounded by the walls 113, and the region of the InP layer 116 is small.

The growth of InP from the side walls 114 and 115 in the (011) direction differs from that in the (0$\bar{1}$1) direction. Therefore, the width in the (0$\bar{1}$1) direction in which the side walls point is decreased in advance. Consequently, the InP layer 116 is evenly formed, and the mesa structures 112 are buried flat.

Eighth Embodiment

In the above seventh embodiment, the shape of the mesa structure 112 to be buried is a square.

When a mesa structure 151 is circular as shown in FIG. 15, it is only necessary to form the planar shape of the inner surface of a wall 152 into an ellipse. In this case, the major axis direction of this elliptical shape is set in the (011) direction in which the growth rate is high. This is because the growth surface from the wall perpendicular to this direction forms an A-surface system, as described in the first embodiment.

For example, as illustrated in FIG. 15, a spacing $L_3$ in the major axis direction is set to approximately 20 μm, and a spacing $L_4$ in the minor axis direction is set to approximately 8 μm. Note in this case, the depth of the trench, i.e., the height of the mesa structure 151 is about 4μm.

Ninth Embodiment

In the above seventh and eighth embodiments, walls surrounding a mesa structure (active region) are formed singly. However, the present invention is not limited to these embodiments.

For example, as illustrated in the plan view of FIG. 16 or the perspective view of FIG. 17, it is also possible to form triple walls $168_1$, $168_2$, and $168_3$ or $178_1$, $178_2$, and $178_3$.

In FIG. 16, reference numerals $166_1$, $166_2$, and $166_3$ denote the bottom surfaces of trenches formed between a mesa structure and the wall $168_1$, between the walls $168_1$, and $168_2$, and between the walls $168_2$ and $168_3$. Similarly, in FIG. 17, reference numerals $176_1$, $176_2$, and $176_3$ denote the bottom surfaces of trenches formed between a mesa structure 177 and the wall $178_1$, between the walls $178_1$ and $178_2$, and between the walls $178_2$ and $178_3$.

Four embodiments of burying of a mesa structure in a vertical resonator type surface emission laser have been described above. However, the layered structure of a mesa to be buried can take various structures, such as a modulator structure, other than the laser structure.

Also, the growth rate in the horizontal direction from a mesa structure or walls is higher than the growth rate in the direction perpendicular to the substrate surface, since a surface (e.g., a (113) A surface or a (111) B surface) having a growth rate higher than the growth rate of the (001) substrate surface appears. Accordingly, limitations on the spacings between the mesa structure and the walls are loose, so it is possible to realize various dimensions other than those described in the above embodiments.

Tenth Embodiment

FIGS. 18A to 18D and 19A to 19F are sectional and plan views showing the states of optical semiconductor devices during fabrication in each of which a plurality of optical elements (active regions) containing an active layer are formed into an array, like in the seventh to ninth embodiments described above.

In FIGS. 18A to 18D, reference numeral 181 denotes optical elements formed into an array at intervals of about 100μm; and 182 and 182a, buried layers during crystal growth. The optical elements 181 correspond to the waveguides in the first embodiment.

FIGS. 18B and 18D are sectional views taken along the (0$\bar{1}$1) direction and the (011) direction, respectively. Note that in FIGS. 18A to 18D, the same reference numerals as in FIGS. 1A to 1C denote the same parts.

As illustrated in FIGS. 18A and 18B, in this embodiment, as in the previous embodiments, the growth of the buried layer 182 during crystal growth on the side surfaces perpendicular to the (011) direction of the optical elements 181 is faster than the growth on the side surfaces perpendicular to the (0$\bar{1}$1) direction.

Consequently, as shown in FIGS. 18C and 18D, portions between the side surfaces perpendicular to the (011) direction of the optical elements 181 are buried before portions between the side surfaces perpendicular to the (0$\bar{1}$1) direction of the optical elements 181 are completely buried. The result is that no flat surface can be obtained.

Figures 19A, 19B, 19C, 19D, 19E, 19F:
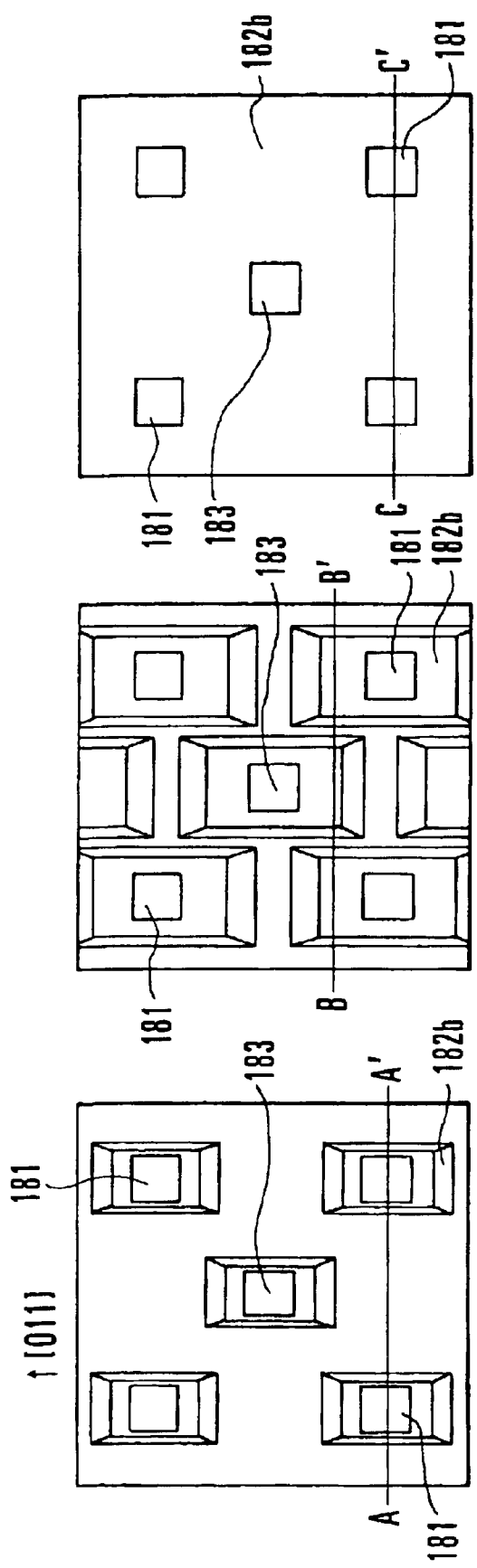
FIGS. 19A to 19F are plan and sectional views showing the arrangement of an optical semiconductor device according to the 10th embodiment of the present invention, in which an array of a plurality of optical elements is formed.

In contrast, as illustrated in FIGS. 19A to 19F showing the state of the this embodiment, a dummy portion 183 is formed at the center of a square at the four corners of which four optical elements 181 are arranged into an array. With this arrangement, a buried layer 182b having a flat surface can be obtained as shown in FIG. 19C.

FIGS. 19A to 19F illustrate a buried layer 182b, when the dummy portion 183 is formed, from the state during formation to the state at the completion of burying.

FIG. 19D is a sectional view taken along the line A–A' in FIG. 19A, FIG. 19E is a sectional view taken along the line B–B' in FIG. 19B, and FIG. 19F is a sectional view taken along the line C–C' in FIG. 19C.

As described in the previous embodiments, the dummy portion 183 can be formed simultaneously with the optical elements 181.

When the dummy portion 183 is thus formed, the distance between the side surfaces perpendicular to the (0$\bar{1}$1) direction of the optical elements 181 becomes shorter than the distance between the side surfaces perpendicular to the (011) direction.

As a consequence, when Fe-doped InP is crystal-grown such that the crystal grown in the (100) direction is discouraged as in the previous embodiments, InP is buried between the side surfaces perpendicular to the (011) direction of the optical elements 181 as shown in FIGS. 19B and 19E. The result is that the spacing in the (0$\bar{1}$1) direction is narrowed.

Consequently, a buried layer 182b is formed flat as illustrated in FIGS. 19C and 19F. Note that in FIGS. 19A to 19F, the same reference numerals as in FIGS. 1A and 1B denote the same parts.

Eleventh Embodiment

In the above 10th embodiment, the planar shape of the optical element is square. However, the present invention is not restricted to this.

Figure 20A:
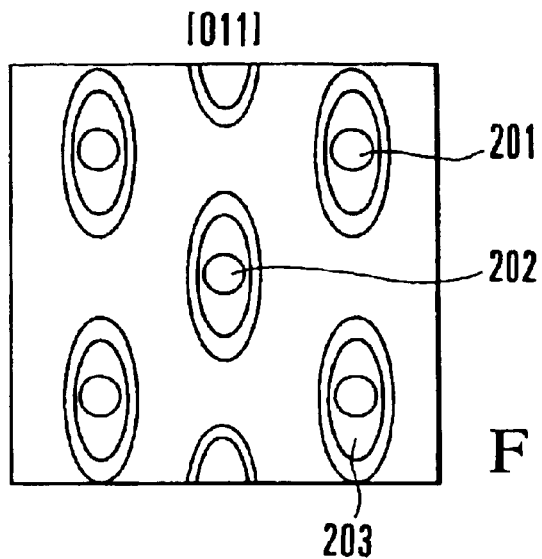
FIGS. 20A to 20C are plan views showing the arrangement of an optical semiconductor device according to the 11th embodiment of the present invention, in which an array of a plurality of optical elements is formed.
Figure 20B:
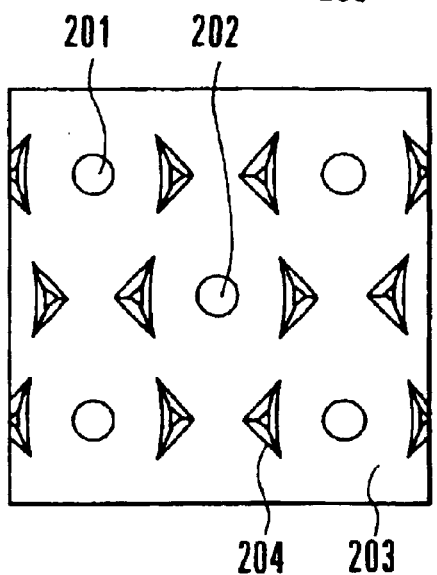
Figure 20C:
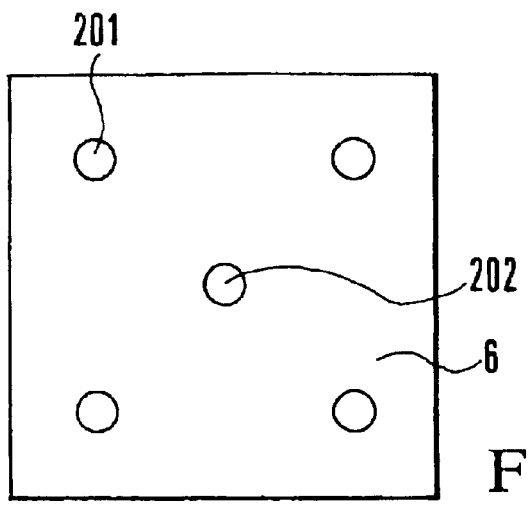

Even when optical elements 201 whose planar shape is circular are arranged into an array as illustrated in FIG. 20C, the same effect as in the above embodiment can be attained by arranging a dummy portion 202 having the same shape at the center of a square at the four corners of which four optical elements 201 are arranged.

In this structure, InP 203 to be buried so grows as to spread into an elliptical shape as shown in FIG. 20A and FIGS. 34A and 34B. FIG. 34A is a perspective view of a circular optical element, and FIG. 34B is a plan view showing the state in which InP grows around the optical element.

As illustrated in FIG. 20B, immediately before completion of the burying, the InP 203 so crystal-grows as to leave gaps 204 behind. Finally, a flat buried layer 6 is formed as in FIG. 20C.

To apply a driving current (voltage) to the optical semiconductor device as described in the first embodiment, it is necessary to form an electrode with a predetermined area to be connected to the electrode contacting layer 5 (FIGS. 1A and 1B).

When, however, the trenches 14 and 15 are formed and an insulating or semi-insulating semiconductor such as Fe-doped InP is buried in these trenches as illustrated in FIGS. 1A and 1B, most region of the electrode is formed on the electrode contacting layer via a thin insulating layer.

Since this produces a capacitance, the capacitance of a whole element cannot be satisfactorily decreased. This makes a high-speed operation impossible.

This parasitic capacitance can be decreased by forming a trench in the region below the electrode formation portion and burying the trench with, e.g., Fe-doped InP.

Optical semiconductor devices according to other embodiments of the present invention in which a trench is also formed in an electrode formation region will be described below.

Twelfth Embodiment

Figure 21:
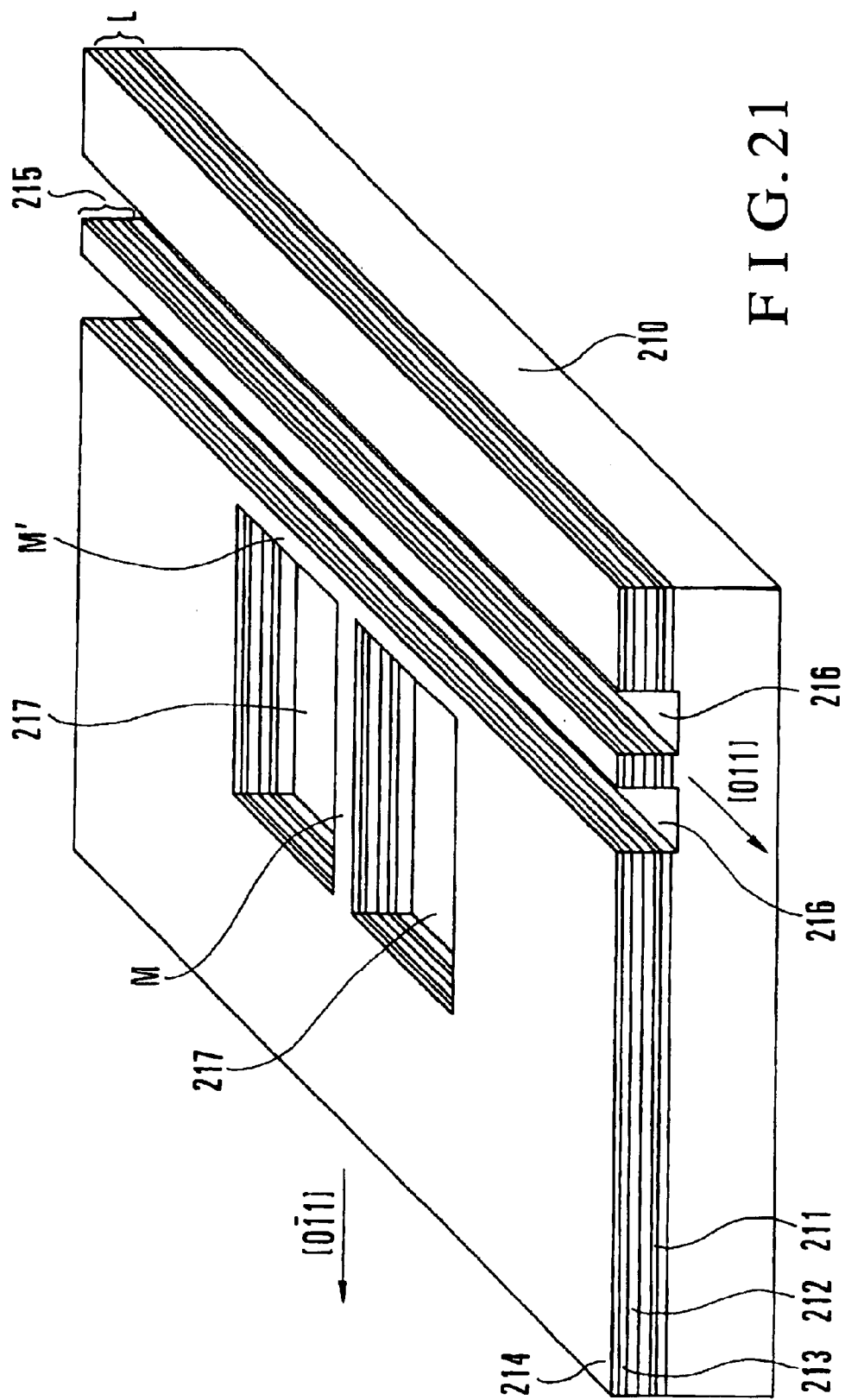
FIG. 21 is a perspective view showing part of a process of fabricating a semiconductor laser having electrode and wiring regions for explaining the arrangement of an optical semiconductor device according to still another embodiment of the present invention.

FIG. 21 is a perspective view showing the arrangement of a portion of an optical semiconductor device according to the 12th embodiment of the present invention.

Referring to FIG. 21, a substrate 210 is made from InP whose orientation is (001), and a laser structure L consists of a material system of InP and InGaAsP. This laser structure L is formed by sandwiching a laser active layer 211 between two layers different in conductivity type.

On this laser structure L, a laser contact layer 212 and a semiconductor protective layer 213 are stacked.

In FIG. 21, reference numeral 214 denotes a mask consisting of SiO$_2$ in which holes are formed in regions corresponding to trenches 216 and 217 to be buried.

By using this mask 214, etching is performed to a depth reaching the substrate 210 by reactive ion etching (RIE) using C$_2$H$_6$ and H$_2$ as reactive gases. Consequently, the trenches 216 about 10$\mu$m wide are formed, and a mesa structure 215 which oscillates a laser is formed accordingly.

In this device, the extending direction of the mesa structure 215 is the (011) direction, and the longitudinal direction of the trenches 217 in a region on which an electrode is formed is the (0$\bar{1}$1) direction.

Since the growth occurs faster in the (011) direction as previously described, the trenches 217 are formed to have a rectangular planar shape of 50m×100 $\mu$m which is long in the (011) direction.

After the trenches 216 and 217 are thus formed, the mask 214 is used as a selective growth mask to bury the trenches 216 and 217 with semi-insulating InP using Fe as a dopant in accordance with HVPE.

Figure 22:
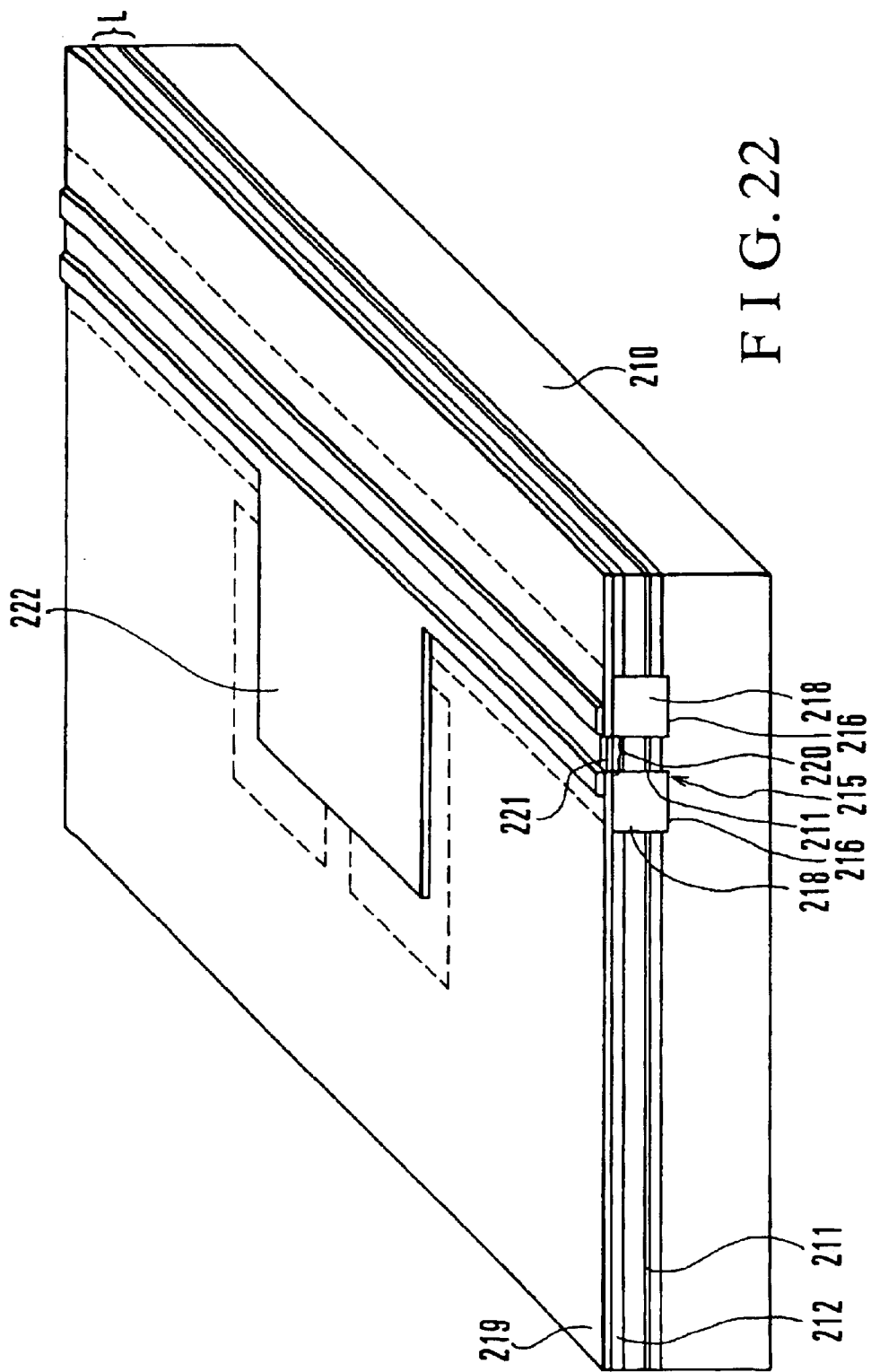
FIG. 22 is a perspective view of a semiconductor laser for explaining the arrangement of a semiconductor device according to still another embodiment of the present invention.

Thereafter, the mask 214 and the semiconductor protective layer 213 are removed. As illustrated in FIG. 22, an insulating film 219 is so formed as to cover a portion up to the top of a buried layer 218, and an ohmic electrode 221 is formed on the mesa structure 215 through an opening 220.

An electrode 222 is then formed in a region on the trenches 217 so as to be connected to the ohmic contact 221.

Consequently, the trenches 216 and 217 are buried flat, and the parasitic capacitance of the electrode 222 can also be decreased.

Note that in FIG. 22, in regions indicated by the dotted lines, the trenches 216 and 217 buried with the buried layer 218 made from the Fe-doped semi-insulating InP are present below the insulating film 219.

As described above, even when the trenches 216 and 217 are buried to a depth of about 4 $\mu$m or more, a flat burying is readily possible as in the previous embodiments. This can realize a low-capacitance element even after the electrode 222 is formed on the trenches 217.

As an example, when the depth of the trenches 216 and 217 is about 10 $\mu$m and the dimensions of the electrode 222 are 100 $\mu$m×100 $\mu$m, the capacitance in the formation region of the electrode 222 is approximately 0.1 pF, and the 3-dB band is 50 GHz in the case of 50-$\Omega$ termination.

In contrast, if the electrode 222 is formed without forming the trenches 216 and 217, the capacitance in the electrode formation region is approximately 0.6 pF, and the 3-dB band is 8 GHz in the 50-$\Omega$ termination.

Figure 23:
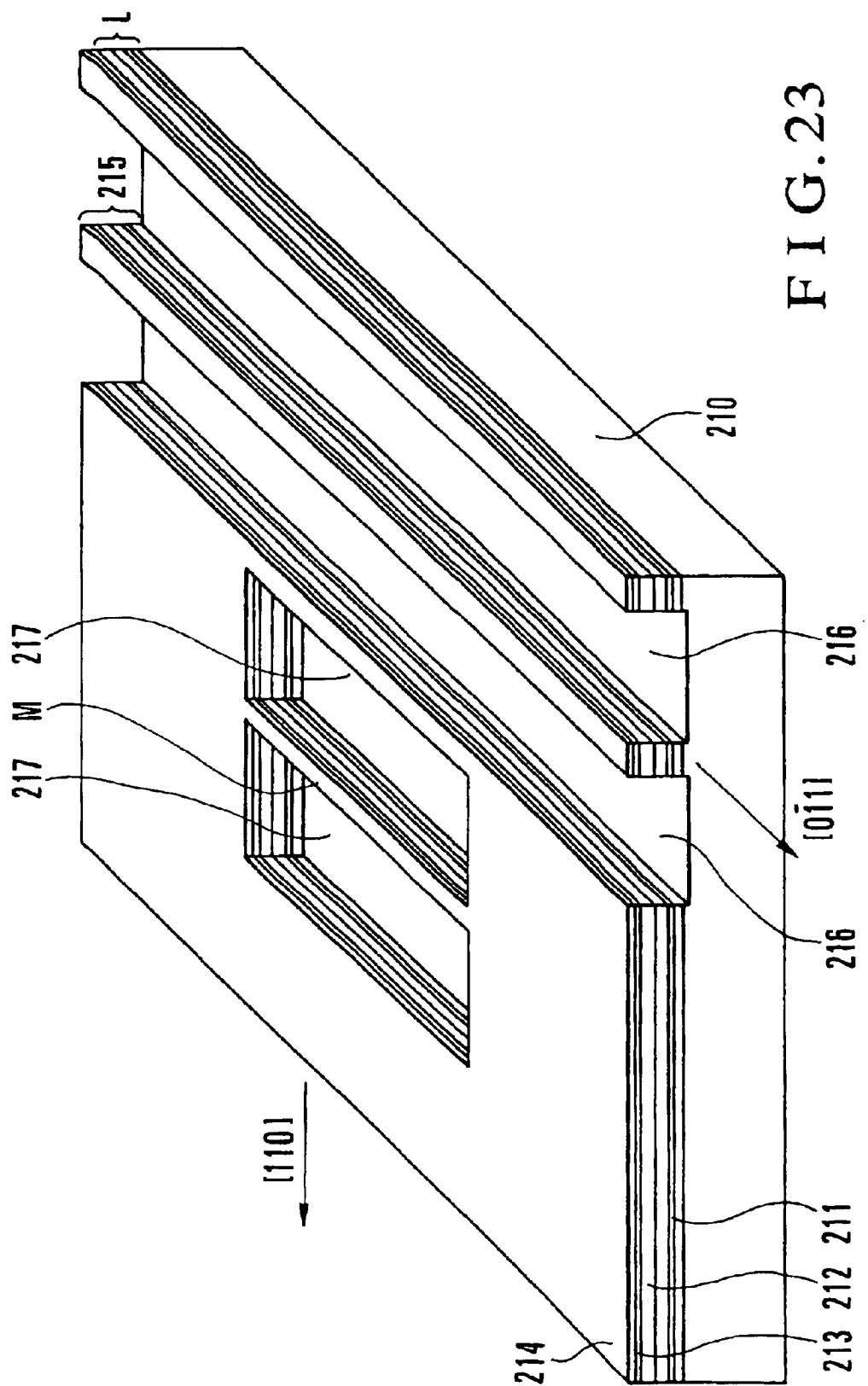
FIG. 23 is a perspective view showing part of a process of fabricating a semiconductor laser having electrode and wiring regions for explaining the arrangement of a semiconductor device according to still another embodiment of the present invention.

FIG. 23 shows a trench structure when the mesa structure 215 points in the (0$\bar{1}$1) direction.

Referring to FIG. 23, the width of the trenches 216 is about 50 $\mu$m, i.e., the same as the width of the trenches 217 in the electrode formation region. The rest of the structure and the device formation process are identical with those of the device shown in FIG. 21.

Thirteenth Embodiment

Figure 24:
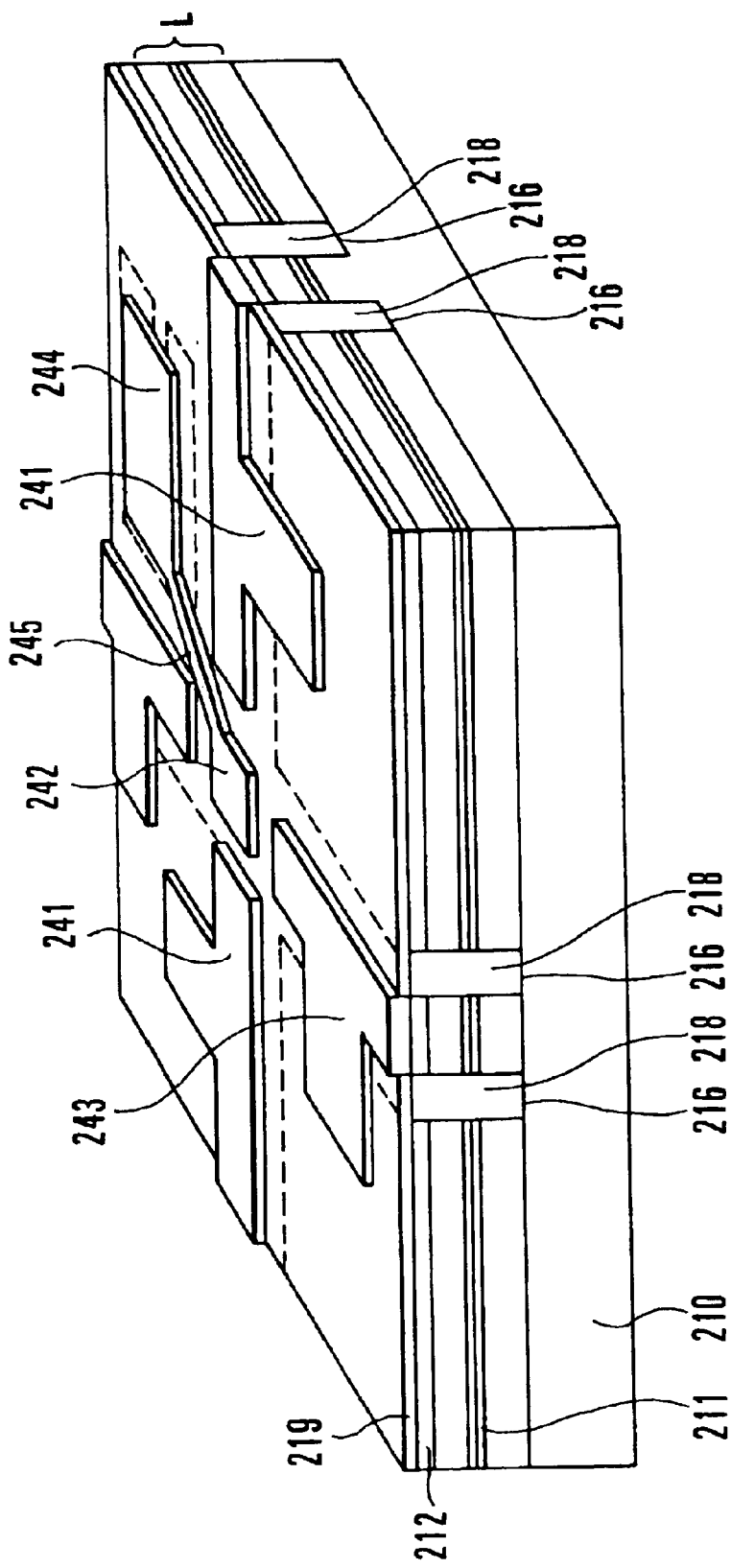
FIG. 24 is a perspective view showing the arrangement of a transverse light injection type bistable laser as a semiconductor device according to still another embodiment of the present invention.

FIG. 24 is a perspective view of the arrangement of still another embodiment of the semiconductor device according to the present invention, which illustrates a transverse light injection type bistable laser. In FIG. 24, the same reference numerals as in FIG. 23 denote the same parts.

The transverse light injection type bistable laser shown in FIG. 24 is formed by the same fabrication steps as in the 12th embodiment described above.

The semiconductor device thus formed has a laser unit 241, a saturable absorbing unit 242, and an optical amplifier 243.

Note that in FIG. 24, in regions indicated by the dotted lines, trenches 216 and 217 buried with a buried layer 218 are present below an insulating film 219.

In the transverse light injection type bistable laser with the above arrangement, an epitaxial wafer has a quantum well structure, and a bistable operation is performed due to the interaction between the laser unit 241 and the saturable absorbing unit 242.

The saturable absorbing unit 242 applies a voltage lower than th built-in voltage of a laser diode by using the supersaturation characteristics of a quantum well.

Control light is amplified by the optical amplifier 243 and fed into the saturable absorbing unit 242.

Once the control light is incident, the laser unit 241 which has not performed laser oscillation starts oscillating and keeps emitting the laser light even after the control light disappeared (bistable operation).

To stop the laser light once oscillated, a deep reverse bias voltage must be applied to the saturable absorbing unit 242.

In the semiconductor device illustrated in FIG. 24, a low-capacitance electrode 244 and a low-capacitance interconnect line 245 according to this embodiment are formed to rapidly apply a deep reverse bias to the supersaturation absorbing unit 242.

Fourteenth Embodiment

Figure 25:
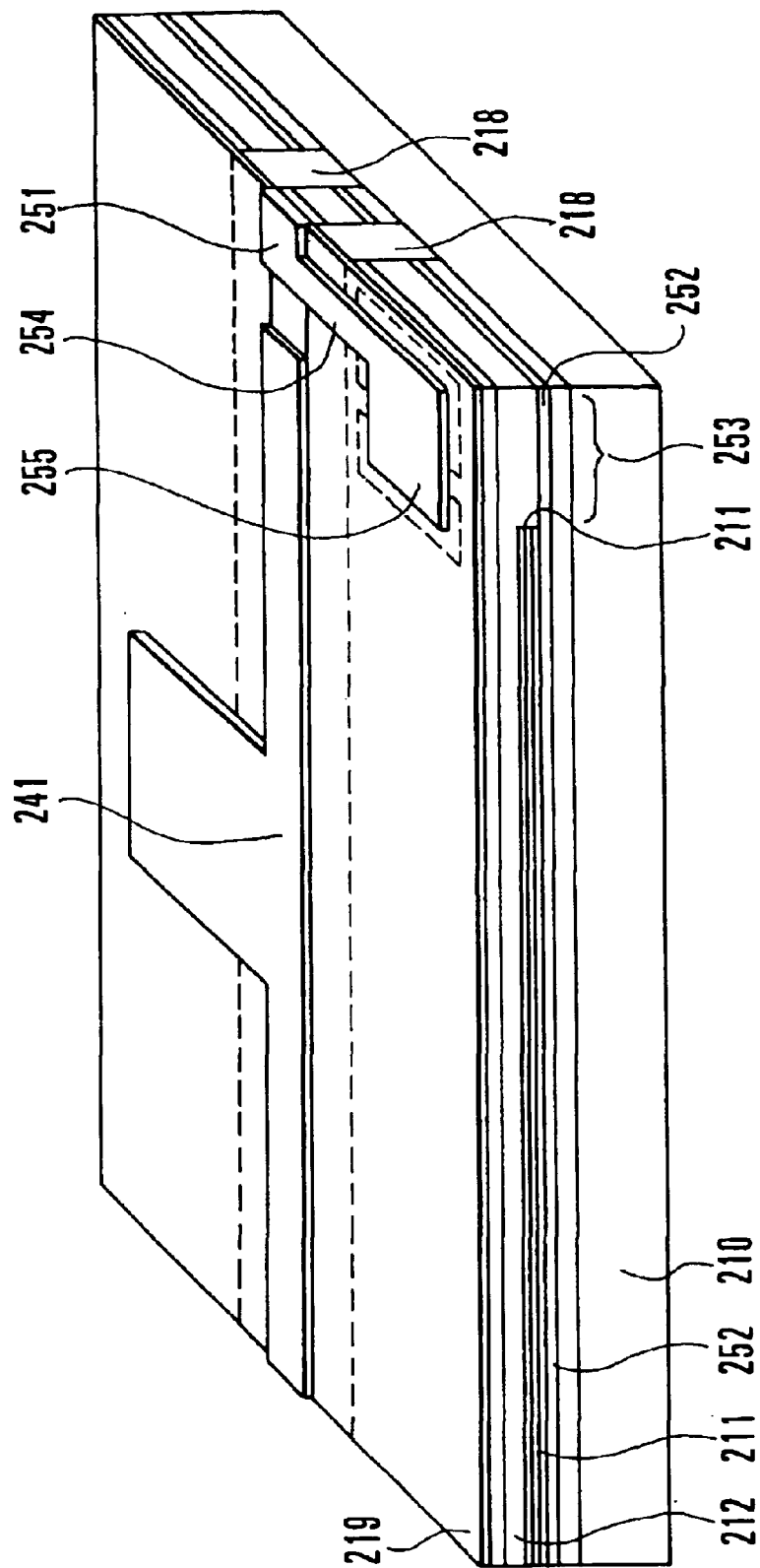
FIG. 25 is a perspective view showing the arrangement of a semiconductor mode-locked laser as a semiconductor device according to still another embodiment of the present invention.

FIG. 25 is a perspective view of the arrangement of still another embodiment of the semiconductor device according to the present invention, which shows a semiconductor integrated mode-locked laser. In FIG. 25, the same reference numerals as in FIG. 24 denote the same parts.

Referring to FIG. 25, this semiconductor integrated mode-locked laser has a laser unit 241 and an optical modulator 251.

Note that in FIG. 25, in regions indicated by the dotted lines, trenches 216 and 217 buried with a buried layer 218 are present below an insulating film 219.

Note also that an epitaxial wafer consists of an active layer 211 having quantum wells for laser oscillation and a light absorbing layer 252 with a quantum well structure for the optical modulator 251.

The active layer 211 is removed from an optical modulation region 253.

This epitaxial structure is fabricated as follows. That is, layers up to the active layer 211 are formed on a substrate 210, and the optical modulation region 253 of this active layer is etched away.

Subsequently, a cladding layer (not shown), a contact layer 211, and an InP protective layer (not shown) are regrown on the entire surface, thereby performing the regrowth on the entire epitaxial wafer.

Mode-locked light pulses can be obtained by modulating the optical modulator 251 at a period in which light travels around once in the element.

Since this period is usually shorter than 100 ps, an electrode 255 and an interconnect line 254 to which a modulated signal is applied must have low capacitances.

As illustrated in FIG. 25, therefore, the low-capacitance electrode 255 and the low-capacitance interconnect line 254 according to this embodiment are formed.

The trenches formed below the electrode 255 and the interconnect line 254 and buried by the buried layer 218 are as deep as approximately 10 μm to obtain a high speed of a period of 100 ps or more.

Fifteenth Embodiment

Figure 26:
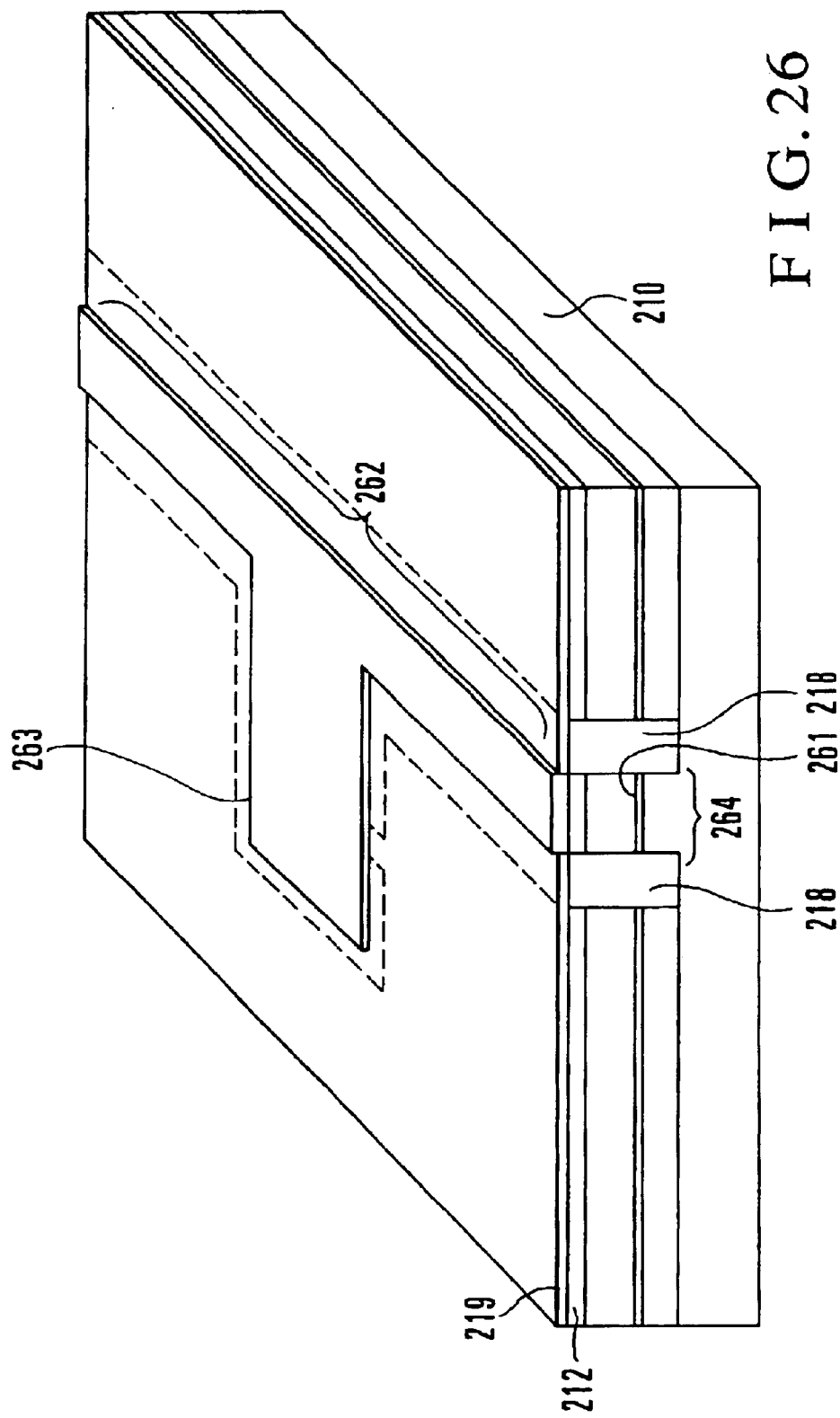
FIG. 26 is a perspective view showing the arrangement of a waveguide photodetector as a semiconductor device according to still another embodiment of the present invention.

FIG. 26 is a perspective view of the arrangement of still another embodiment of the semiconductor device according to the present invention, in which a waveguide photodetector is illustrated.

The device shown in FIG. 26 is different from the device shown in FIG. 22 in that a light absorbing layer 261 is formed in place of the active layer 211 in FIG. 22 and a wide photodetector waveguide 262 for improving optical coupling and an electrode 263 having a deep trench for improving the operating speed also are formed.

In this arrangement, incident light from a device end face 264 applies a reverse bias voltage to the device through the electrode 263 with a low capacitance and at the same time extracts a detection signal to the outside.

Note that in FIG. 26, in regions indicated by the dotted lines, trenches buried with a buried layer 218 are present below an insulating film 219.

In the embodiments previously described, the insulating film 219 is formed on the trenches 217 for forming the electrode 222, as, for example, illustrated in FIG. 22.

Since, however, the trenches 217 are buried with the semi-insulating buried layer 218, the insulating film 219 is not necessarily formed.

Figure 27:
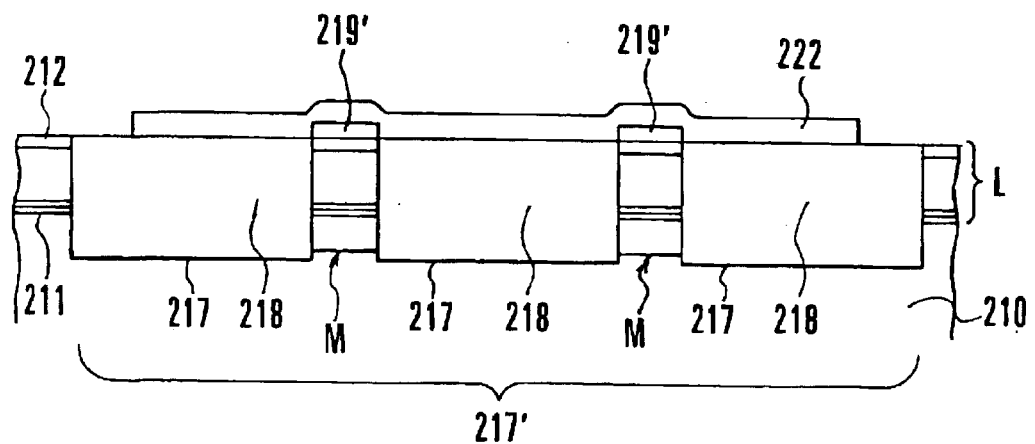
FIG. 27 is an enlarged sectional view for explaining a remaining laser region, an electrode metal, and an insulating structure according to the semiconductor device in FIG. 21.

If this is the case, as illustrated in FIG. 27, an insulating film 219' can be formed only on top of laser regions M left behind.

Note that the insulating film 219 is apparently sometimes unnecessary even when the buried layer 218 is not entirely semi-insulating (e.g., when a layer having a different composition from that of the buried layer 218 is inserted into the layer 218 and this layer is an undoped n-type conductive layer).

Figure 28:
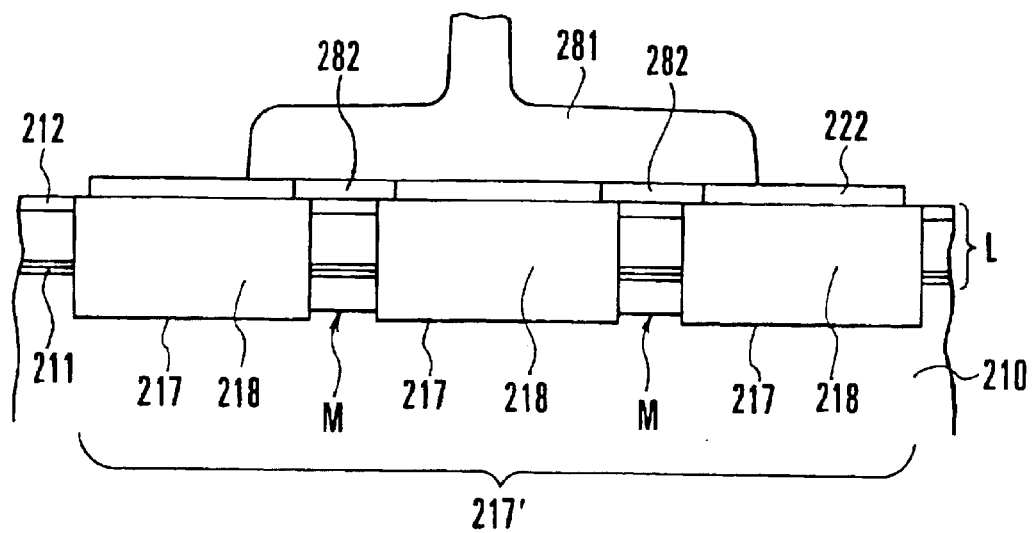
FIG. 28 is an enlarged sectional view for explaining the remaining laser region, the electrode metal, and the insulating structure according to the semiconductor device in FIG. 21.

Also, as shown in the sectional view of FIG. 28, it is only necessary to form the electrode 222 so as not to cover laser regions M left behind.

The mask 214 shown in FIGS. 21 and 23 can also be directly used as the insulating film 219' on the remaining laser regions M.

Note that it is also possible to form interconnections for external wiring with the electrode 222 not formed on the laser regions M.

As shown in FIG. 28, even if a metal wire or metal ribbon 281 for external wiring is bonded to an electrode formation portion 217', gaps 282 are formed on the laser regions M.

Accordingly, the upper portions of the laser regions M do not directly contact the metal wire or metal ribbon 281.

In the above embodiments, the electrode 222 and the interconnect line are formed on the laser structure L via the insulating film 219. However, the present invention is not limited to these.

That is, the same effect as above can be attained so long as at least the insulating film 219 is formed on the laser region M left behind between the two trenches 217 and on the laser region M' (see FIG. 21) left behind between the trenches 217 and the adjacent trench 216.

Also, in a structure in which the trenches 217 and 216 are connected, the insulating 219 need not be used.

In the above embodiments, hydride vapor phase epitaxy (HVPE) is used as the crystal growth method. However, the present invention is also effective when other crystal growth methods are used, because trenches can be buried by other crystal growth methods.

Particularly, suitable methods other than HVPE are chloride vapor phase epitaxy (CVPE) and metal organic vapor phase epitaxy (MOVPE).

In the above embodiments, iron-doped InP is used to bury the laser mesa formation region and the electrode formation region. However, InP doped with titanium or chromium, rather than iron, or InP doped with both titanium or chromium and iron, is also a high-resistance semiconductor. Therefore, a semiconductor layer made from such a material can also be used.

It is also possible to insert at least one semiconductor layer having different composition, such as InGaAsP, between these high-resistance semiconductor layers.

This semiconductor layer functions as a block layer for carriers injected from the laser region into the high-resistance semiconductor and not captured by an impurity such as iron.

The semiconductor layer having this function is therefore effective to obtain a high laser output (if two or more such layers are to be inserted, these inserted layers can be different in composition).

Furthermore, an electrode formation region can be buried even in a multilayered structure including this inserted layer.

Although the above embodiments have been described by taking an InP laser as an example, the present invention can be practiced by using some other material system.

As an example, the present invention can be practiced by a semiconductor laser in which a cladding layer and a high-resistance buried layer are made from GaAs and an active layer consists of strained quantum wells having an InGaAs well layer.

To increase the resistance of GaAs of a buried layer, it is only necessary to dope vanadium, chromium, or oxygen.

The resistance can also be increased by optimizing the growth conditions and decreasing the background carrier concentration.

In forming a block layer in the GaAs buried layer, strained InGaAs can be used as the block layer.

The present invention can be similarly practiced by a GaAs/AlGaAs laser. In this laser, a buried layer is AlGaAs, and an inserted layer is GaAs or AlGaAs having a different composition from that of the buried layer.

Oxygen can be doped to increase the resistance of AlGaAs of the buried layer.

The resistance can also be increased by optimizing the growth conditions and decreasing the background carrier concentration.

Moreover, the present invention can be practiced by using various other material systems.

According to the present invention as has been described above, in burying an optical element including an active layer with, e.g., a semi-insulating semiconductor buried layer, a semiconductor region having side surfaces opposing the side surfaces of the optical element is formed, thereby forming walls such that in a portion where the growth rate of crystal growth is lower, the distance between the side surface of the optical element and the side surface of the semiconductor region is shorter. Portions between these side surfaces are buried with the buried layer.

Consequently, even if the optical element is constituted by waveguides in different directions, a buried heterostructure (BH structure) which is buried flat can be effectively formed.

Also, when a plurality of optical elements are formed into an array, a dummy portion is formed at the center of a square at the four corners of which the optical elements are arranged. Portions between these optical elements and the dummy portion are buried with a buried layer.

Accordingly, even when an optical element is a rectangular or circular surface emission laser and a plurality of such optical elements are arranged, a flatly buried heterostructure can be formed.

What is claimed is:

1. A method of fabricating an optical semiconductor device, comprising the steps of:

forming a plurality of optical semiconductor elements on a semiconductor substrate;

forming a projection-like dummy portion in a center of a square at four corners of which said optical semiconductor elements are arranged; and forming a buried layer by vapor phase epitaxy so as to bury a portion between said optical semiconductor elements and said dummy portion.

2. A method according to claim 1, wherein said buried layer is formed by vapor phase epitaxy using one of a chloride-based source gas and a hydride-based source gas.

* * * * *